United States Patent
Tang

(10) Patent No.: US 12,283,341 B2
(45) Date of Patent: Apr. 22, 2025

(54) DYNAMIC CLOCK MASK BASED ON READ DATA FOR POWER SAVING

(71) Applicant: SanDisk Technologies LLC, Addison, TX (US)

(72) Inventor: Tianyu Tang, Milpitas, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 18/353,709

(22) Filed: Jul. 17, 2023

(65) Prior Publication Data
US 2024/0221793 A1 Jul. 4, 2024

Related U.S. Application Data

(60) Provisional application No. 63/435,627, filed on Dec. 28, 2022.

(51) Int. Cl.
*G11C 7/10* (2006.01)
*G11C 7/22* (2006.01)

(52) U.S. Cl.
CPC ........... *G11C 7/1009* (2013.01); *G11C 7/106* (2013.01); *G11C 7/1069* (2013.01); *G11C 7/222* (2013.01)

(58) Field of Classification Search
CPC ..... G11C 7/1009; G11C 7/106; G11C 7/1069; G11C 7/222
See application file for complete search history.

(56) References Cited

U.S. PATENT DOCUMENTS 6,049,488 A * 4/2000 Sawada .............. G11C 7/1057
365/194
2017/0372769 A1* 12/2017 Kizer ................. G11C 11/4063

* cited by examiner

*Primary Examiner* — Xiaochun L Chen
(74) *Attorney, Agent, or Firm* — Sheppard, Mullin, Richter & Hampton LLP

(57) ABSTRACT

Systems and methods disclosed herein provide for reduced power composition during data read operations from memory devices through gating of clock signals based on a bit pattern of data to be read from the memory device. Example devices and methods disclosed herein comprise receiving a command to read data from a memory structure of the memory device and latching a bit pattern of the data from the memory structure to a data register based on the received command. The disclose systems and methods use the bit pattern to generate a clock mask according to similarities between bit values within the bit pattern. When a read enable signal is detected on a read enable interface of the embodiments disclosed herein, the clock mask is gated based on the clock mask, and bit values are latched to an input/output interface of the memory device in accordance with the gated read enable signal.

20 Claims, 18 Drawing Sheets

DYNAMIC CLOCK MASK BASED ON READ DATA FOR POWER SAVING

CROSS REFERENCE TO RELATED APPLICATIONS

This application claims the benefit of and priority to U.S. Provisional Patent Application No. 63/435,627, filed on Dec. 28, 2022, the contents of which are incorporated herein by reference in their entirety.

DESCRIPTION OF RELATED ART

Semiconductor memory is widely used in various electronic devices, such as cellular telephones, digital cameras, personal digital assistants, medical electronics, mobile and non-mobile computing devices, vehicles, and so forth. Such semiconductor memory may comprise non-volatile memory and/or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

NAND-type flash memories can store more data now than ever before. With this comes a need to transfer data in and out of the memory devices at increasingly faster rates. However, challenges arise with faster data transfers. In some cases, those challenges are due to meeting timing specifications at a memory device interface, while also meeting power budgets.

Timing specifications may be provided by industry specifications. The Open NAND Flash Interface Specification, Revision 3.2 (Jun. 12, 2103), which is published by the Open NAND Flash Interface (ONFI) Working Group, is one such example. Such specifications may define pinouts, pad assignments, ball assignments, etc. The pinouts may define, for example, which pin is to be used for a read enable (RE), which pins are to be used for data I/O, etc. Likewise, the pad assignments may define pad location, spacing, and usage (e.g., which pad is RE). Note that specifications for other technologies such as NOR may use terms such as output enable (OE) instead of read enable.

Specifications may also define timing parameters for reading data from the memory device for different modes such as single data rate (SDR), double data rate (DDR), quad data rate (QDR), etc. One example timing parameter is the latency between when RE is asserted by the host and data is available from the memory chip on its output pins (or pads). One challenge in meeting latency is that data transfer rates continue to increase. For example, the ONFI 3.2 standard mentioned above extends a non-volatile DDR2 (NV-DDR2) interface from 400 MB/s to 533 MB/s.

As data transfer rates continue to increase, it is becoming more difficult to meet specified timing parameters, such as read latency. Clock speeds are also increasing to meet the increased data transfer rates, and toggling the high speed clocks consumes significant on chip power.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
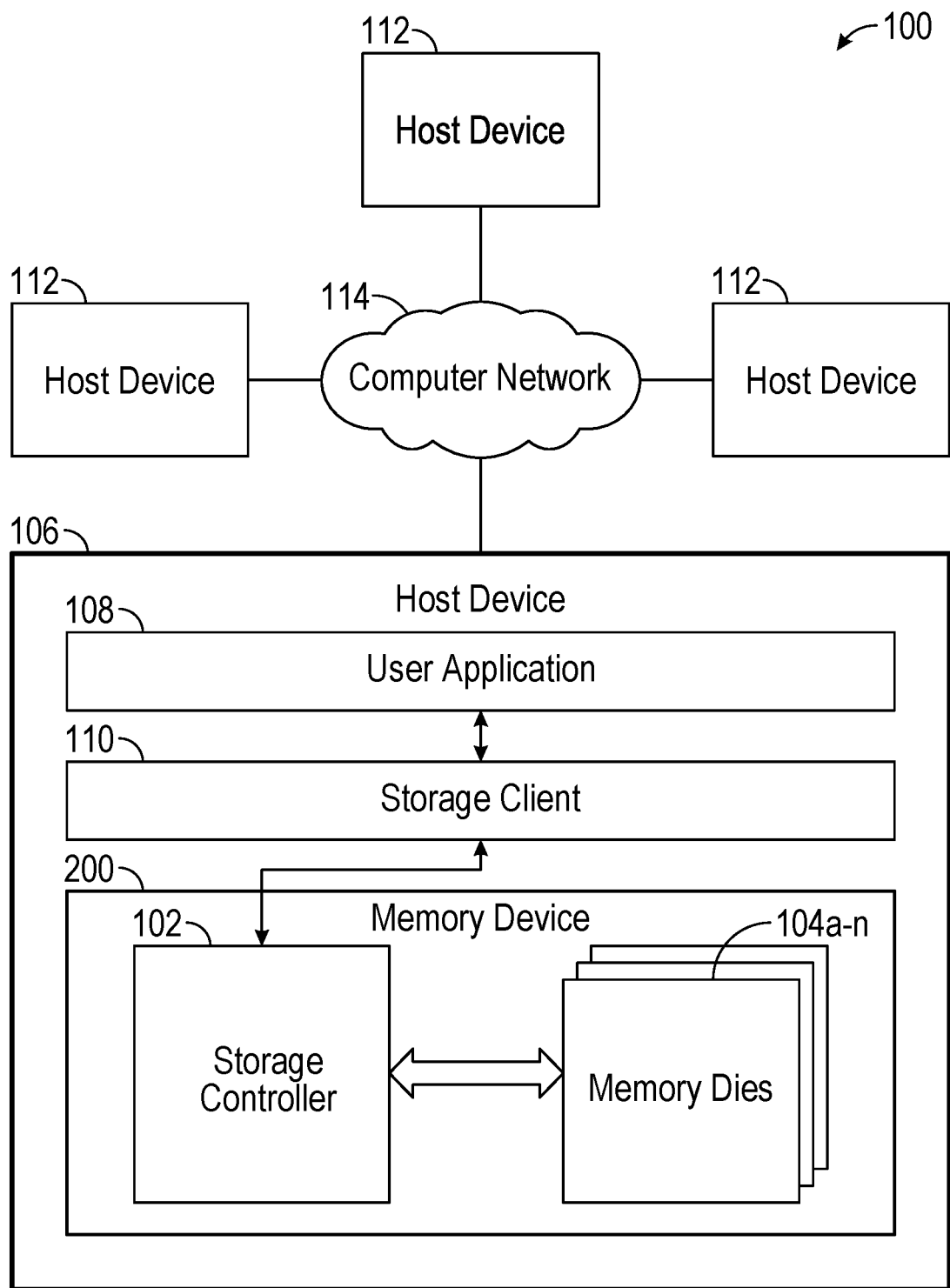
FIG. 1 is a block diagram of an example memory system, in connection with which, example embodiments of the disclosed technology can be implemented.

The figures are not exhaustive and do not limit the present disclosure to the precise form disclosed.

DETAILED DESCRIPTION

As introduced above, a challenge that arises with faster data transfers is readying reading data out of a memory device at increased data transfer rates while staying within power budgets, which constrain power usage within the memory device. A significant source of power consumption on a memory device occurs as a result of toggling clock signals used for clocking data into and out of the memory device. Clock signals can be used to transfer data from or into a memory structure on the memory device to an input/output (I/O) interface over which the data can be transferred to or received from an external device. Clock signals are consistently toggled at a high speed to achieve rising and falling edges (or transitions) on which data latching or other operations occur. Regardless of the data read from or written to the memory structure, the clock signal for clocking the data does not change and thus the toggling speed remains unchanged along a clock path within the memory device. Delay stages, such as signal buffers and repeaters, can be provided at various points along the clock path to ensure signal integrity of the clock signal over the entire length of the clock path. However, these delay stages must also be driven so to ensure the clock signal is maintained. As a result, maintaining a high speed clock can consume significant on chip power.

An example clock signal used for clocking data out of a memory structure and to an I/O interface, is a read enable (RE) signal. An RE signal can be issued by an external device and detected by an RE interface of the memory device, which duplicates the signal internally for clocking data out of the memory structure, through a data pipeline, and onto an I/O interface. In the conventional systems, the RE signal can be a high speed signal that is toggled at a constant speed and duty cycle to read from memory structure to first-in-first-out buffers and ultimately to the I/O interface. A data strobe (DQS) signal is used to clock data from the I/O interface to an external device. The I/O interface comprises a number of I/O pads, which can be physically distributed about the memory device at varying depths (e.g., distances) and from the RE interface. Thus, to maintain the integrity of the RE signal, various distinct delay stages may be required and driven to ensure that the RE signal is maintained along the clock path. This leads to challenges in power consumption, as the majority of power consumed by a memory die during a read operation is due to maintaining the RE signal integrity.

One approach to reduce power consumption and stay within a power budget is through control of clock signals. Embodiments of the disclosed technology overcome the above short coming of the conventional systems by generating a clock mask that can be used to gate a clock signal (such as the RE signal) based on data to be read from a memory structure according to a data read operation. For example, during a data read operation, an address of data to be read from a memory structure is received by the memory device and the data located at the received address is transferred from the memory structure to a data register. This transferring to the data structure occurs prior to detecting an RE signal on an RE interface. Accordingly, the data to be read out of the memory device is known to the memory device prior to detecting the RE signal. The embodiments herein leverage this known data to generate a clock mask based similarities in bit values within the data. The clock mask can be used to remove one or more edges from the clock signal.

For example, the data latched to the data register comprises a data pattern formed of a plurality of bytes. The data pattern comprises a plurality of sequential bytes, each having respective bit values. Embodiments disclosed herein determine whether there are identical bit values between sequential bytes and generate clock enable signals that operate to remove edges from the RE signal associated with the identical bit values (e.g., used for latching the bit values to the I/O interface). As an illustrative example, some embodiments determine whether a unit of a byte is identical to a unit of a sequentially next byte of the data pattern. Each byte is associated with an edge of the RE signal on which each respective byte can be latched to the I/O interface. A clock mask can be generated that comprises signals containing instructions that, when provided to one or more delay stages along a clock path, gates the RE signal so to remove one or more edges associated with the unit of the next sequential byte determined to be identical to the unit of the sequentially preceding byte. An edge of a clock signal is associated with a unit or byte when that edge is used for clocking a latching operation of the unit or byte. A unit of a byte may refer to a nibble (e.g., half a byte), a crumb (e.g., a quarter of a byte), or a bit. Since edges can be removed from the RE signal traversing the clock path, the data latched to the I/O interface is maintained at a previous state of the data (e.g., at bit values of the sequentially preceding byte). Since the previous state is the same as the sequentially next state, the data on the I/O interface remains valid and can be read from the memory device according to the DQS signal. If sequential portions of the data are different, the RE signal is permitted to toggle unmasked, which latches data to the I/O interface according to the RE signal.

By removing edges of the clock signal that traverses the clock path, power saving is achieved. This is a result of no longer requiring the clock signal be toggled at a high speed for every edge. Toggling of the clock signal only occurs when needed to latch data on the I/O interface that have values different from the value of sequentially preceding data. Toggling of the clock signal can be avoided when the data to be latched is identical to the sequentially preceding data, thereby reducing the number of transitions (or edges) and reducing power consumption.

FIGS. 1 to 4H depict an example memory system that can be used to implement the technology disclosed herein. FIG. 1 is a schematic block diagram illustrating a memory system 100. The memory system 100 includes a memory device 200 (also referred to herein as a storage device), a host device 106, at least one host device 112, and a computer network 114.

The host device 106 may be a computing device (e.g., laptop, desktop, smartphone, tablet, digital camera, wearable smart device, and so on) that includes one or more processors and readable storage devices (such as, but not limited to, RAM, ROM, flash memory, hard disk drive, solid state memory) that store processor readable code (also referred to herein as instructions or software) for programming storage controller 102 to perform the methods described herein. The host device 106 may also include additional system memory, one or more input/output interfaces, and/or one or more input/output devices in communication with the one or more processors, as well as other components well known in the art.

The memory system 100 includes at least one memory device 200, comprising the storage controller 102 and a plurality of memory dies 104. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

In some embodiments, the memory system 100 may include two or more memory devices. Each memory device 200 may include a plurality of memory dies 104, such as flash memory, nano random access memory ("nano RAM or NRAM"), magneto-resistive RAM ("MRAM"), dynamic RAM ("DRAM"), phase change RAM ("PRAM"), etc. The data memory device 200 may also include other types of non-volatile and/or volatile data storage, such as dynamic RAM ("DRAM"), static RAM ("SRAM"), magnetic data storage, optical data storage, and/or other data storage technologies.

The memory device 200 may be a component within a host device 106 as depicted in FIG. 1, and may be connected using a system bus, such as a peripheral component interconnect express ("PCI-e") bus, a Serial Advanced Technology Attachment ("serial ATA") bus, or the like. In another embodiment, the memory device 200 may be external to the host device 106 and is connected via a wired connection, such as, but not limited to, a universal serial bus ("USB") connection, an Institute of Electrical and Electronics Engineers ("IEEE") 1394 bus ("FireWire"), or the like. In other embodiments, the memory device 200 may be connected to the host device 106 using a peripheral component interconnect ("PCI") express bus using external electrical or optical bus extension or bus networking solution such as Infiniband or PCI Express Advanced Switching ("PCIe-AS"), or the like.

In various embodiments, the memory device 200 may be in the form of a dual-inline memory die ("DIMM"), a daughter card, or a micro-module. In another embodiment, the memory device 200 may be a component within a rack-mounted blade. In another embodiment, the memory device 200 may be contained within a package that is integrated directly onto a higher level assembly (e.g., mother-board, laptop, graphics processor, etc.). In another embodiment, individual components comprising the memory device 200 may be integrated directly onto a higher level assembly without intermediate packaging.

In some embodiments, instead of directly connected to the host device 106 via a wired connection, the data memory device 200 may be connected to the host device 106 over a wireless connection. For example, the data memory device 200 may include a storage area network ("SAN") storage device, a network attached storage ("NAS") device, a network share, or the like. In some embodiments, the memory system 100 may be connected to the host via a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host device 106 and the data memory device 200.

The memory system 100 includes at least one host device 106 connected to the memory device 200. Multiple host devices may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. "Computer" refers to any computing device. Examples of a computer include, but are not limited to, a personal computer, a laptop, a tablet, a desktop, a server, a main frame, a supercomputer, a computing node, a virtual computer, a hand held device, a smart phone, a cell phone, a system on a chip, a single chip computer, and the like. In another embodiment, a host device 106 may be a client and the memory device 200 may operate autonomously to service data requests sent from the host device 106. In this embodiment, the host device 106 and memory device 200 may be connected using a computer network, system bus, DAS or other communication means suitable for connection between a computer and an autonomous memory device 200.

The illustrative example shown in FIG. 1, the memory system 100 includes a user application 108 in communication with a storage client 110 as part of the host device 106. "Application" refers to any software that is executed on a device above a level of the operating system. An application will typically be loaded by the operating system for execution and will make function calls to the operating system for lower-level services. An application often has a user interface, but this is not always the case. Therefore, the term 'application' includes background processes that execute at a higher level than the operating system.

"Operating system" refers to logic, typically software, that supports a device's basic functions, such as scheduling tasks, managing files, executing applications, and interacting with peripheral devices. In normal parlance, an application is said to execute "above" the operating system, meaning that the operating system is necessary in order to load and execute the application and the application relies on modules of the operating system in most cases, not vice-versa. The operating system also typically intermediates between applications and drivers. Drivers are said to execute "below" the operating system because they intermediate between the operating system and hardware components or peripheral devices.

In various embodiments, the user application 108 may be a software application operating on or in conjunction with the storage client 110. The storage client 110 manages files and data and utilizes the functions and features of the storage controller 102 and associated memory dies 104. "File" refers to a unitary data structure for storing, retrieving, and communicating data and/or instructions. A file is distinguished from other types of packaging by having associated management metadata utilized by the operating system to identify, characterize, and access the file. Representative examples of storage clients include, but are not limited to, a server, a file system, an operating system, a database management system ("DBMS"), a volume manager, and the like. The storage client 110 may be in communication with the storage controller 102 within the memory device 200.

In various embodiments, the memory system 100 may include one or more clients connected to one or more host device 112 through one or more computer networks 114. A host device 112 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 114 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 114 may also include a network from the IEEE 802 family of network technologies, such Ethernet, token ring, Wi-Fi, WiMax, and the like.

The computer network 114 may include servers, switches, routers, cabling, radios, and other equipment used to facilitate networking the host device 106 or host devices and host devices 112 or clients. In some embodiments, the memory system 100 may include one or more host devices 112 and host device 106 that communicate as peers over a computer network 114. In other embodiments, the memory system 100 may include multiple memory devices 200 that communicate as peers over a computer network 114. One of skill in the art will recognize other computer networks comprising one or more computer networks and related equipment with single or redundant connection(s) between one or more clients or other computer with one or more memory devices 200 or one or more memory devices 200 connected to one or more host devices. In one embodiment, the memory system 100 may include two or more memory devices 200 connected through the computer network 114 to a host device 112 without a host device 106.

In some embodiments, the storage client 110 communicates with the storage controller 102 through a host device interface comprising an Input/Output (I/O) interface. "Interface" refers to a protocol and associated circuits, circuitry, components, devices, systems, sub-systems, and the like that enable one device, component, or apparatus to interact and/or communicate with another device, component, or apparatus. For example, the memory device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. A sector of data is typically 512 bytes, corresponding to the size of a sector in magnetic disk drives.

In various embodiments number of sectors form a block (or data block), anywhere from 8 sectors, which is 4 KB, for example, up to 32, 64, 128 or more sectors. Different sized blocks and sectors can also be used. In certain storage systems, such as those interfacing with the Windows® operating systems, the data blocks may be referred to as clusters. In other storage systems, such as those interfacing with UNIX, Linux, or similar operating systems, the data blocks may be referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die(s) 104. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

Management of a data block by a storage manager may include specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices need not directly or necessarily associate logical addresses with particular physical data blocks. These storage devices may emulate a conventional block storage interface to maintain compatibility with a block storage client 110.

In some embodiments, the storage controller 102 may provide a block I/O emulation layer, which serves as a block device interface, or API. In these embodiments, the storage client 110 communicates with the storage device through this block device interface. The block I/O emulation layer may receive commands and logical addresses from the storage client 110 in accordance with this block device interface. As a result, the block I/O emulation layer may provide the storage device compatibility with a block storage client 110.

In some embodiments, a storage client 110 communicates with the storage controller 102 through a host device interface comprising a direct interface. In these embodiments, the memory device 200 directly exchanges information specific to non-volatile storage devices. Memory device 200 using direct interface may store data in the memory die(s) 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die(s) 104.

The storage controller 102 may receive a logical address and a command from the storage client 110 and perform the corresponding operation in relation to the memory die(s) 104. The storage controller 102 may support block I/O emulation, a direct interface, or both.

Figure 2A:
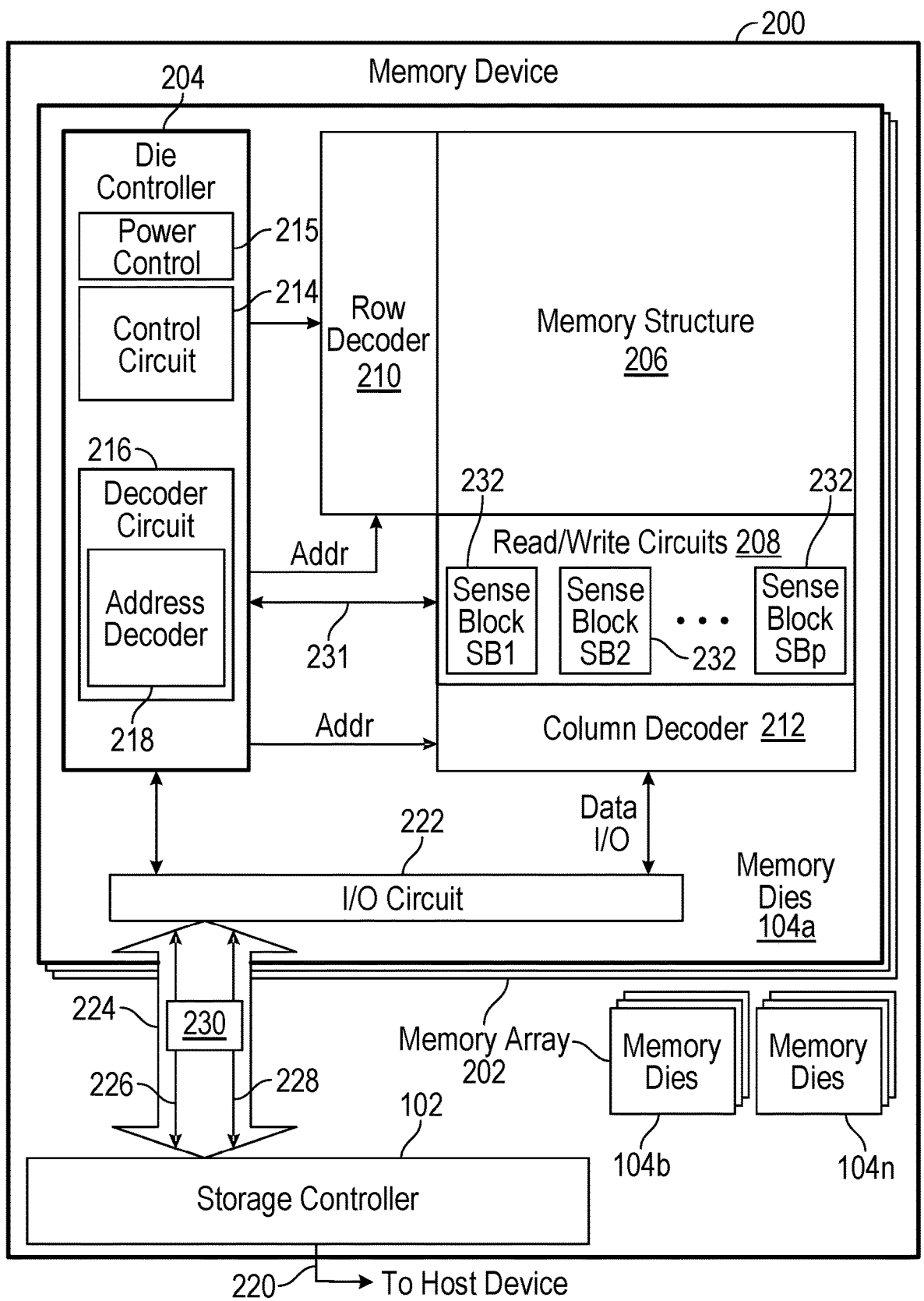
FIG. 2A is a block diagram of an example memory device, in connection with which, example embodiments of the disclosed technology can be implemented.

FIG. 2A is a functional block diagram of an example memory device 200. The components depicted in FIG. 2A are electrical circuits.

The memory device 200 may include a storage controller 102 and a memory array 202 comprised of a number of memory dies 104*a-n*, the storage controller 102 and memory dies 104*a-n* being effectively as described with regard to FIG. 1. Each memory die 104*a-n* can be a complete memory die or a partial memory die and may include a die controller 204, at least one memory structure 206, and read/write circuits 208. The following description will be made with reference to memory die 104*a* as an example of memory dies 104*a-n*, where each memory die may include same or similar components and function in the same or similar way. Thus, while reference herein is made to memory die 104*a*, the same description may be applied equally to memory dies 104*b-n*.

In this context, "memory array" refers to a set of memory cells (also referred to as storage cells) organized into an array structure having rows and columns. A memory array is addressable using a row identifier and a column identifier, each represented as part of an address, such as a column or row address. A non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

In the context of FIG. 2A, memory structure 206 may be addressable by wordlines via a row decoder 210 and by bitlines via a column decoder 212. The read/write circuits 208 include multiple sense blocks 232 including SB1, SB2, . . . , SBp (sensing circuitry) and allow a pages of memory cells to be read or programmed in parallel. Also, many strings of memory cells can be erased in parallel.

"Circuitry", as used herein, refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

A physical page may include memory cells along a row of the memory array for a single plane or for a single memory die. In some embodiments, each memory die 104a-n includes a memory array made up of two equal sized planes. A plane is a division of the memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

The memory structure 206 can be two-dimensional (2D-laid out in a single fabrication plane) or three-dimensional (3D-laid out in multiple fabrication planes). The non-volatile memory array 202 may comprise one or more arrays of memory cells including a 3D array. In one embodiment, the non-volatile memory array 202 may comprise a monolithic three-dimensional memory structure (3D array) in which multiple memory levels are formed above (and not in) a single substrate, such as a wafer, with no intervening substrates. The non-volatile memory array 202 may comprise any type of non-volatile memory that is monolithically formed in one or more physical levels of arrays of memory cells having an active area disposed above a silicon substrate. The non-volatile memory array 202 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

The die controller 204 (also referred to as a die control circuitry) cooperates with the read/write circuits 208 to perform memory operations on memory cells of the non-volatile memory array 202 and includes a control circuit 214 (also referred to as a state machine), a decoder circuit 216 that may incorporate an address decoder 218, and a power control circuit 215. The control circuit 214 provides chip-level control of memory operations on the memory die 104a. The die controller 204 may also include power control circuit 215 that controls the power and voltages supplied to the wordlines, bitlines, and select lines during memory operations. The power control circuit 215 may include voltage circuitry, in one embodiment. Power control circuit 215 may include charge pumps for creating voltages. The sense blocks 232 include bitline drivers. The power control circuit 215 executes under control of the control circuit 214, in various embodiments.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. In one example, the die controller may include buffers such as registers, read-only memory (ROM) fuses and other storage devices for storing default values such as base voltages and other parameters.

"Control circuit" refers to a device, component, element, module, system, sub-system, circuitry, logic, hardware, or circuit configured and/or operational to manage one or more other circuits. For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally. In certain embodiments, a control circuit is responsible to ensure that primary features and functionality of a larger circuit, die, or chip, that includes the control circuit, perform properly. The address decoder 218 provides an address interface between that used by the host or a storage controller 102 to the hardware address used by the row decoder 210 and column decoder 212. Power control circuit 215 controls the power and voltages supplied to the wordlines, bitlines, and select lines during memory operations. The power control circuit 215 includes voltage circuitry, in one embodiment. The power control circuit 215 executes under control of the control circuit 214, in one embodiment.

Commands and data are transferred between the host device and storage controller 102 via a data bus 220, and between the storage controller 102 and an input/output (IO) circuit 222 on each of the memory dies 104a-n via a memory interface 224. The memory interface 224 may be a type of communication bus, comprising a control bus 226 and a data bus 228 (also referred to herein as I/O data bus), over which fixed length command sequences 230 may be transmitted. The command bus may comprise, for example but not limited to, a command bus over which commands are transmitted to the memory die 104a and an address bus over which addresses are transmitted to the memory die 104a. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, a vendor specific interface, a proprietary interface, and the like. In the depicted embodiment, the memory interface 224 is a proprietary interface configured to transfer fixed length command sequences 230.

"Communication bus" refers to hardware, software, firmware, logic, control line(s), and one or more associated communication protocols, that are configured to enable a sender to send data to a receiver. A communication bus may include a data bus and/or a control bus.

"Firmware" refers to logic embodied as processor-executable instructions stored on volatile memory media and/or non-volatile memory media.

"Data bus" refers to a communication bus used to exchange one or more of data bits between two electronic circuits, components, chips, die, and/or systems. A data bus may include one or more signal/control lines. A sender, such as a controller, may send data signals over one or more control lines of the data bus in parallel (operating as a parallel bus) or in series (operating as a serial bus). A data bus may include the hardware, control line(s), software, firmware, logic, and/or the communication protocol used to operate the data bus.

Examples data buses may include 8-bit buses having 8 control lines, 16-bit buses having 16 control lines, 32-bit buses having 32 control lines, 64-bit buses having 64 control lines, and the like. Control lines may carry exclusively communication data, exclusively address data, exclusively control data, or any combination of these types of data.

In various embodiments, a single data bus may be shared by a plurality of components, such as memory die. When multiple chips or memory dies share a data bus, that data may be accessed or transferred by a single memory die or by all the memory dies in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DQS"), or clock, such as strobe signal. In certain embodiments, a control bus and a data bus together may form a communication bus between a sender and a receiver.

"Control bus" refers to a communication bus used to exchange one or more of data, address information, control signals, clock signals, and the like, between two electronic circuits, components, chips, die, and/or systems. A control bus may comprise 1 or more control lines, be configured to operate as a parallel bus or a serial bus, and may include the hardware, control line(s), software, firmware, logic, and/or the communication protocol used to operate the control bus. Typically, a control bus sends control signals to one or more memory die to manage operations on the memory die.

In certain embodiments, the control bus sends control signals such as, for example, one or more of, a write enable ("WEn"), chip enable ("CEn"), read enable ("REn"), a clock signal, strobe signal ("DQS"), command latch enable ("CLE"), address latch enable ("ALE"), and the like.

In certain embodiments, the control bus may not transfer data relating to a storage operation, such as write data or read data. Instead, write data and read data may be transferred over a data bus. In certain embodiments, a control bus and a data bus together may form a communication bus between a sender and a receiver.

The address decoder 218 of the die controller 204 may be coupled to the memory structure 206 in order to identify a location within the memory structure 206 for a storage command. In particular, the address decoder 218 determines a row identifier and a column identifier which together identifies the location within the memory structure 206 that applies to a storage command associated with a command address. The storage command and command address are received in a fixed length command sequence.

The input/output (I/O) circuit 222 may be coupled, through the memory interface 224 and to a I/O circuit 234 of the storage controller 102, to a data bus 220 in order to receive a fixed length command sequence 230. The decoder circuit 216 of the die controller 204 may be coupled through the input/output (IO) circuit 222 to a control bus 226 to receive fixed length command sequences 230 over the data bus 220 via I/O circuit 234. In one embodiment, the data bus 220 may comprise eight control lines, each configured to transfer one bit in parallel across the data bus 220.

The decoder circuit 216 may decode a command address and a storage command from a fixed length command sequence. The control circuit 214 of the die controller 204 may be coupled to the input/output (IO) circuit 222 and decoder circuit 216 and may generate control signals 231 to execute storage commands decoded by the decoder circuit 216. "Control signal" refers to an electrical signal (wired or wireless) sent from one device, component, manager, or controller to another device, component, manager, or controller configured to act in response to the control signal.

The read/write circuits 208 may be coupled to the non-volatile memory array 202 and the control circuit 214 in order to transfer data between the non-volatile memory array 202 and the input/output (IO) circuit 222 in response to the storage commands.

In some implementations, some of the components can be combined. In various designs, one or more of the components (alone or in combination), other than memory structure 206, can be thought of as at least one control circuit or storage controller which is configured to perform the techniques described herein. For example, a control circuit may include any one of, or a combination of, storage controller 102, die controller 204, read/write circuits 208, column decoder 212, control circuit 214, decoder circuit 216, address decoder 218, sense blocks SB1, SB2, . . . , SBp, and so forth.

Associated circuitry may be required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

In various embodiments, memory structure 206 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 206 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 206 is not limited to the examples above. Many different types of memory array architectures or memory technologies can be used to form memory structure 206. No particular non-volatile memory technology is required for purposes of the new claimed embodiments proposed herein. Other examples of suitable technologies for memory cells of the memory structure 206 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 206 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
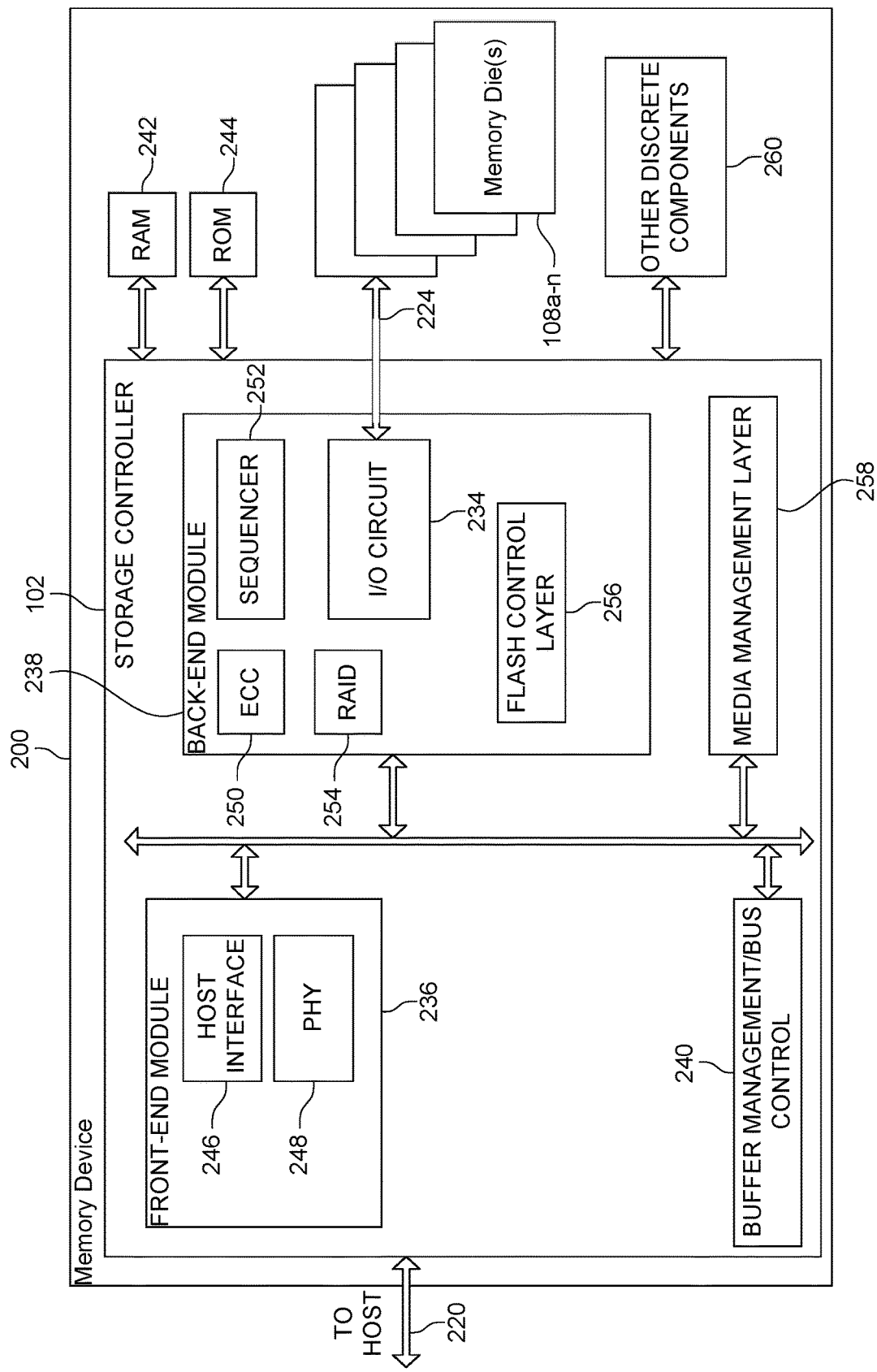
FIG. 2B is a block diagram of an example memory device that depicts more details of an example controller, in connection with which, example embodiments of the disclosed technology can be implemented.

FIG. 2B is a block diagram of example memory device 200 that depicts more details of one embodiment of controller 102. While the storage controller 102 in the embodiment of FIG. 2B is a flash memory controller, it should be appreciated that memory device 200 is not limited to flash memory. Thus, the storage controller 102 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between storage controller 102 and memory dies 104 may be any suitable flash interface, such as Toggle Mode 200, 400, or 800. In one embodiment, memory device 200 may be a card-based system, such as a secure digital (SD) or a micro secure digital (micro-SD) card. In an alternate embodiment, memory system 100 may be part of an embedded memory system. For example, the flash memory may be embedded within the host. In other examples, memory device 200 can be a solid state drive (SSD).

In some embodiments, memory device 200 includes a single channel between storage controller 102 and memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2B, storage controller 102 includes a front-end module 236 that interfaces with a host, a back-end module 238 that interfaces with the memory dies 108, and various other modules that perform functions which will now be described in detail. The components of storage controller 102 depicted in FIG. 2B may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable storage controller 102 to perform the functions described herein.

Referring again to modules of the storage controller 102, a buffer manager/bus control 240 manages buffers in RAM 242 and controls the internal bus arbitration of storage controller 102. ROM 244 stores system boot code. Although illustrated in FIG. 2B as located separately from the storage controller 102, in other embodiments, one or both of RAM 242 and ROM 244 may be located within the storage controller 102. In yet other embodiments, portions of RAM 242 and ROM 244 may be located within the storage controller 102, while other portions may be located outside the controller. Further, in some implementations, the storage controller 102, RAM 242, and ROM 244 may be located on separate semiconductor dies.

Front-end module 236 includes a host interface 246 and a physical layer interface (PHY) 248 that provide the electrical host interface via bus 220 with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 238 includes an error correction code (ECC) engine 250 that encodes the data bytes received from the host, and decodes and error corrects the data bytes read from the memory dies 104. A command sequencer 252 generates command sequences, such as program and erase command sequences, to be transmitted to memory dies 104. A RAID (Redundant Array of Independent Dies) module 254 manages generation of RAID parity and recovery of failed data. The RAID parity may be used as an additional level of integrity protection for the data being written into the memory device 200. In some cases, the RAID module 254 may be a part of the ECC engine 250. Note that the RAID parity may be added as one or more extra dies, or may be added within the existing die, e.g., as an extra plane, an extra block, or extra WLs within a block. As described above in connection with FIG. 2A, the I/O circuit 234 provides command sequences 230 to memory die 104 and receives status information from memory die 104, via memory interface 224. A flash control layer 256 controls the overall operation of back-end module 238.

Additional components of memory device 200 illustrated in FIG. 2B include media management layer (MML) 258, which performs wear leveling of memory cells of memory dies 104, as well as, other discrete components 260, such as external electrical interfaces, external RAM, resistors, capacitors, or other components that may interface with storage controller 102. In alternative embodiments, one or more of the physical layer interface 248, RAID module 254, MML 258, or buffer management/bus controller 240 are optional components.

MML 258 (e.g., Flash Translation Layer (FTL)) may be integrated as part of the flash management for handling flash errors and interfacing with the host. In particular, MML 258 may be a module in flash management and may be responsible for the internals of NAND management. In particular, MML 258 may include an algorithm in the memory device firmware which translates writes from the host into writes to the memory structure 206 of each memory die 104. MML 258 may be needed because: 1) the memory structure 206 may have limited endurance; 2) the memory structure 206 may only be written in multiples of pages; and/or 3) the memory structure 206 may not be written unless it is erased as a block (or a tier within a block in some embodiments). MML 258 understands these potential limitations of the memory structure 206 which may not be visible to the host. Accordingly, MML 258 attempts to translate the writes from host into writes into the memory structure 206.

Storage controller 102 may interface with one or more memory dies 104. In one embodiment, storage controller 102 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the memory device 200 may include one memory dies 104 connected to one storage controller 102. Other embodiments may include multiple memory dies 104 in communication with one or more controllers 102. In one example, the multiple memory dies 104 can be grouped into a set of memory packages. Each memory package may include one or more memory dies 104 in communication with storage controller 102. In one embodiment, a memory package includes a printed circuit board (or similar structure) with one or more memory dies 104 mounted thereon. In some embodiments, a memory package can include molding material to encase the memory dies 104 of the memory package. In some embodiments, storage controller 102 is physically separate from any of the memory packages.

Figure 3:
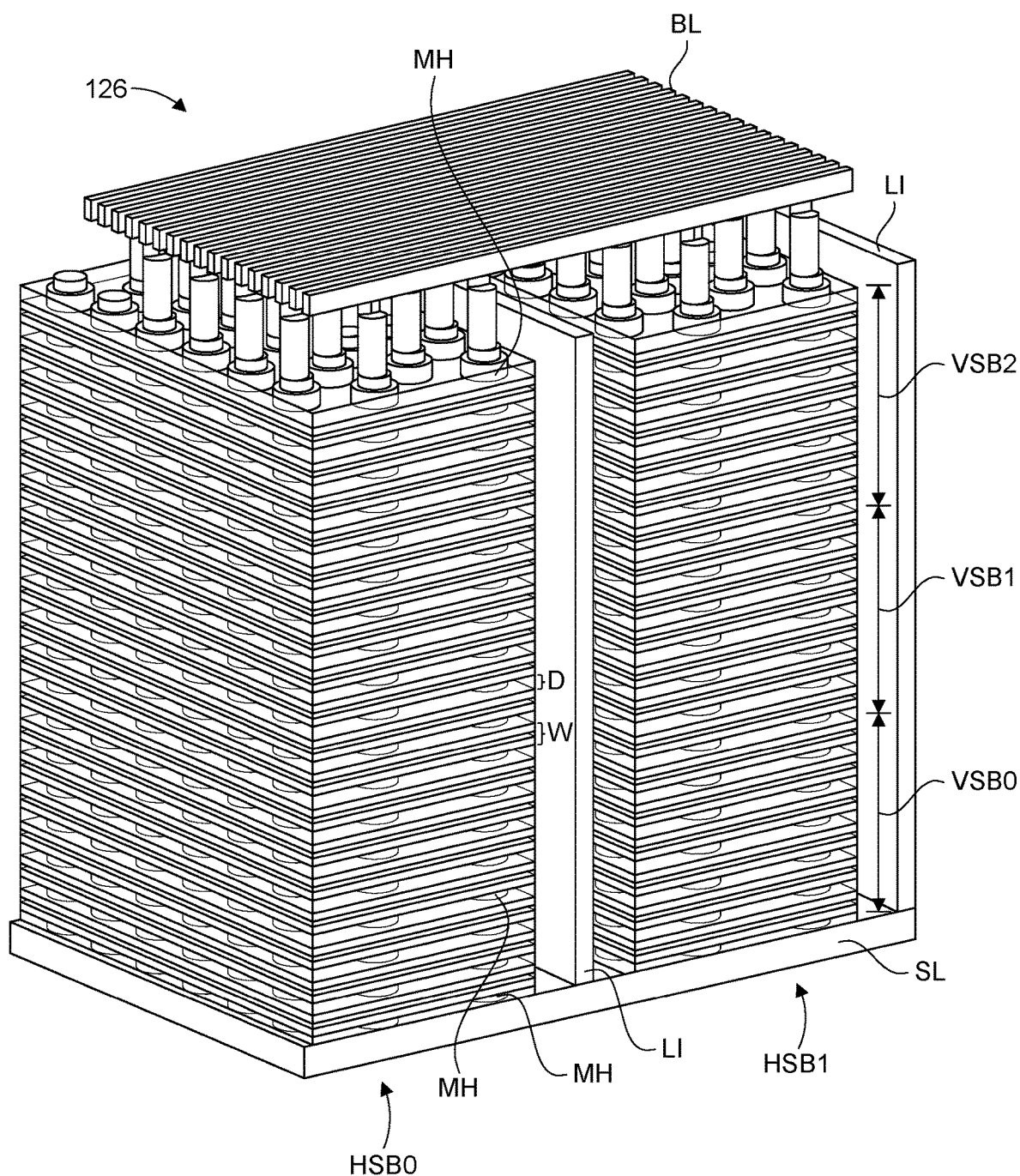
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 206 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and I/O dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 206 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
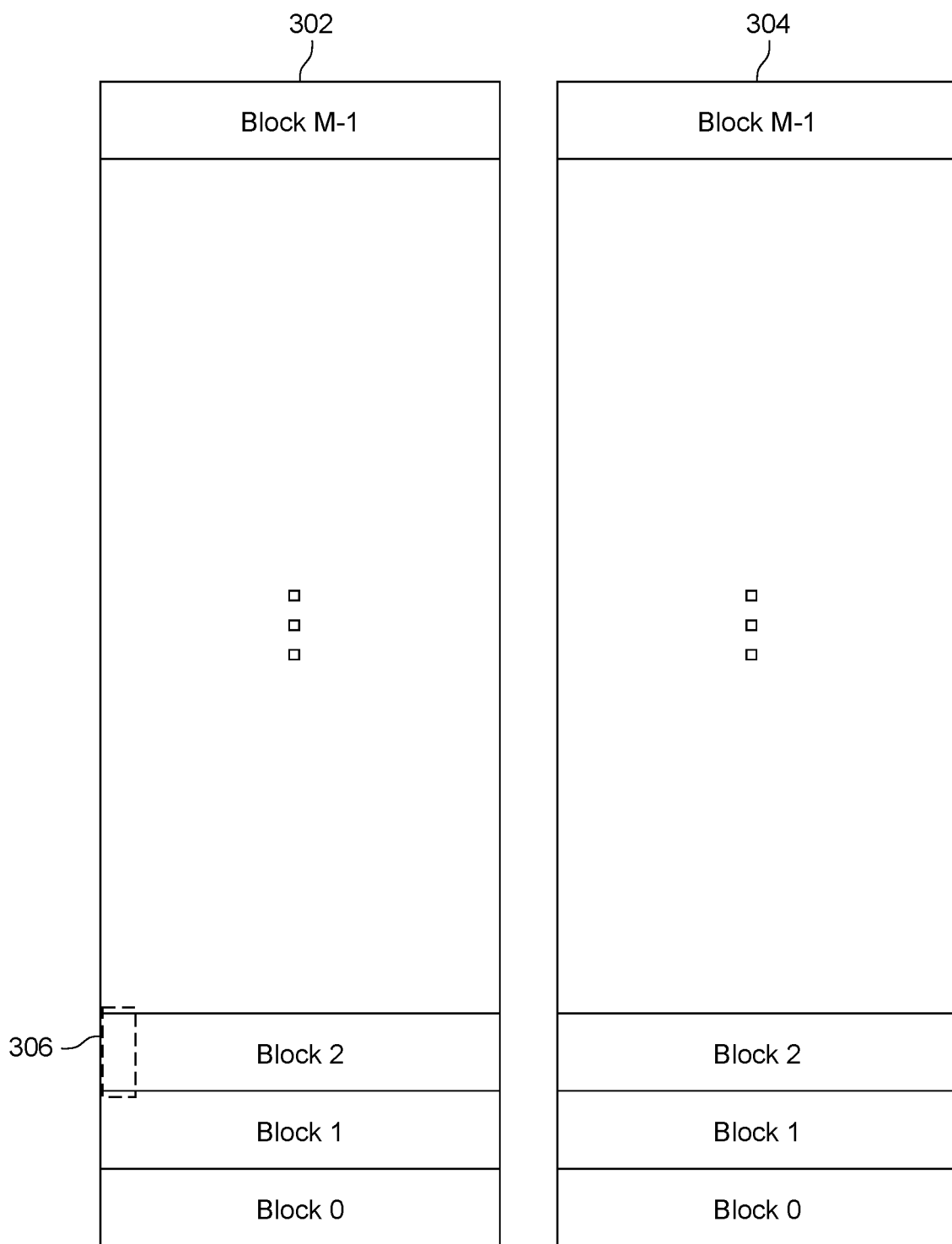
FIG. 4A is a block diagram of an example memory structure having two planes, in connection with which, example embodiments of the disclosed technology can be implemented.

FIG. 4A is a block diagram depicting one example organization of memory structure 206, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 206 to enable the signaling and selection circuits. In some embodiments, a block represents a groups of connected memory cells that share a common set of wordlines.

FIGS. 4B-4F depict an example 3D NAND structure that corresponds to the structure of FIG. 3 and that can be used to implement memory structure 206 of FIGS. 2A and 2B.

Figure 4B:
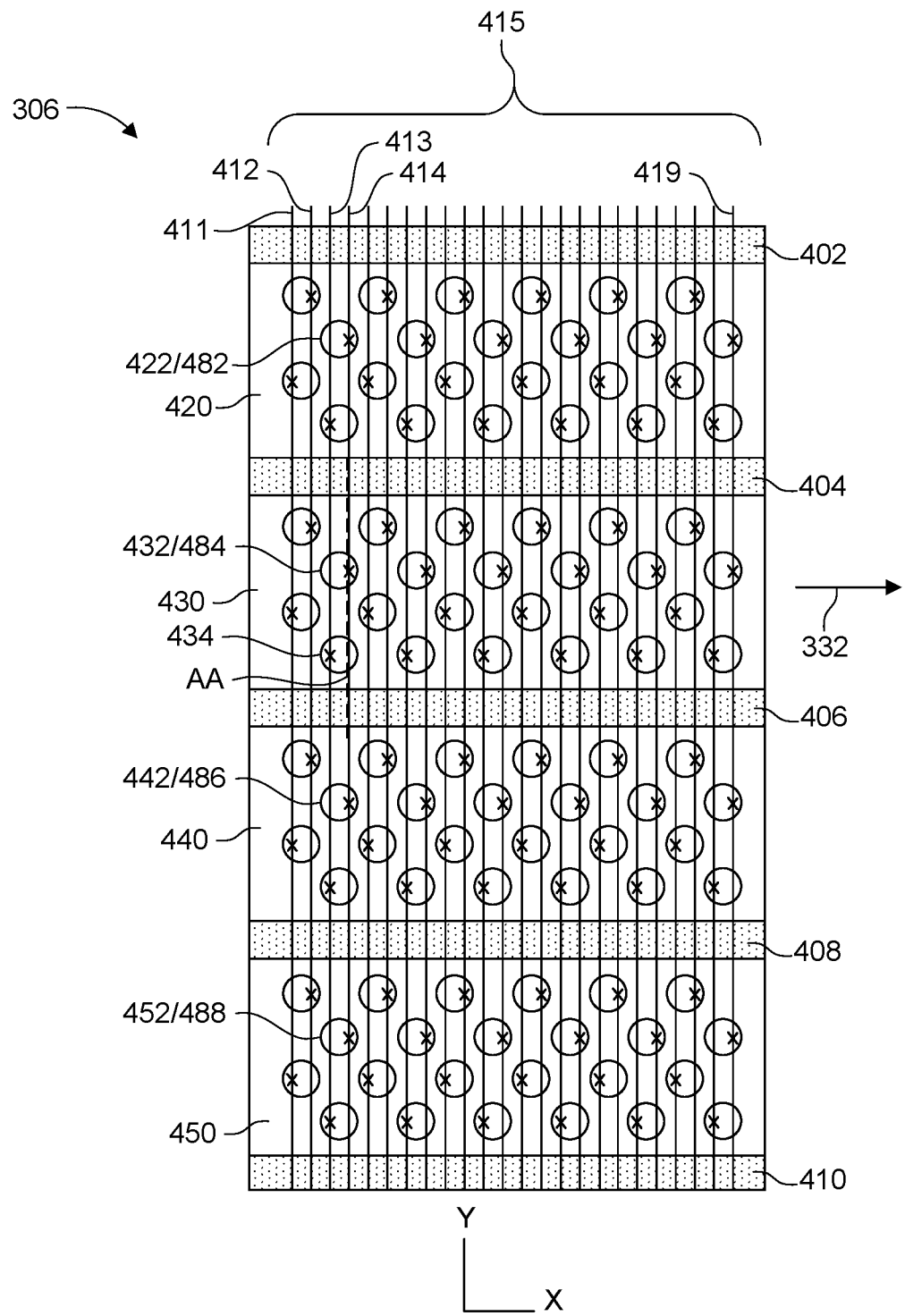
FIG. 4B depicts a top view of a portion of a block of example memory cells, in connection with which, example embodiments of the disclosed technology can be implemented.
Figure 4C:
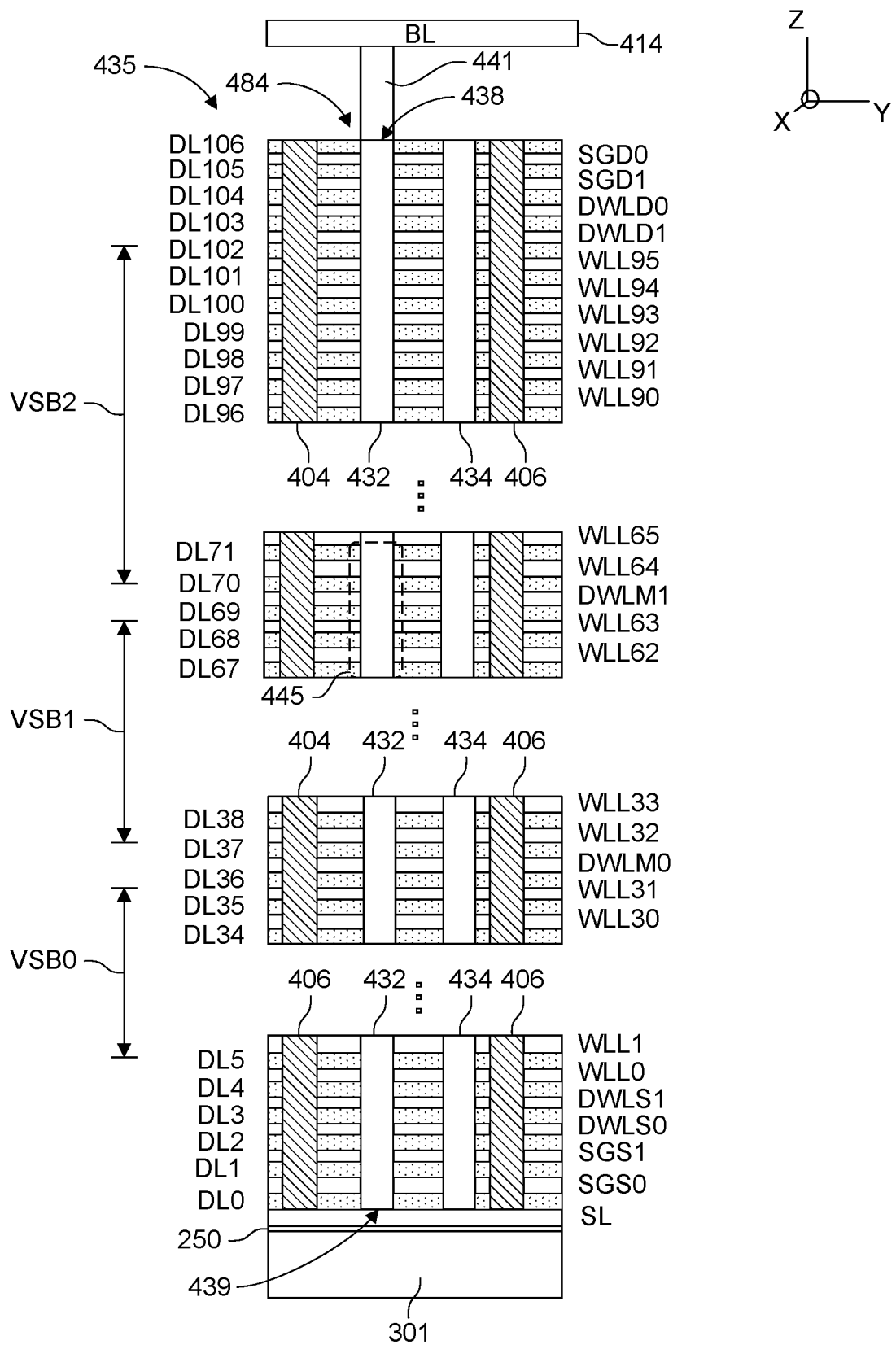
FIG. 4C depicts a stack showing a cross-sectional view along line AA of FIG. 4B.
Figure 4D:
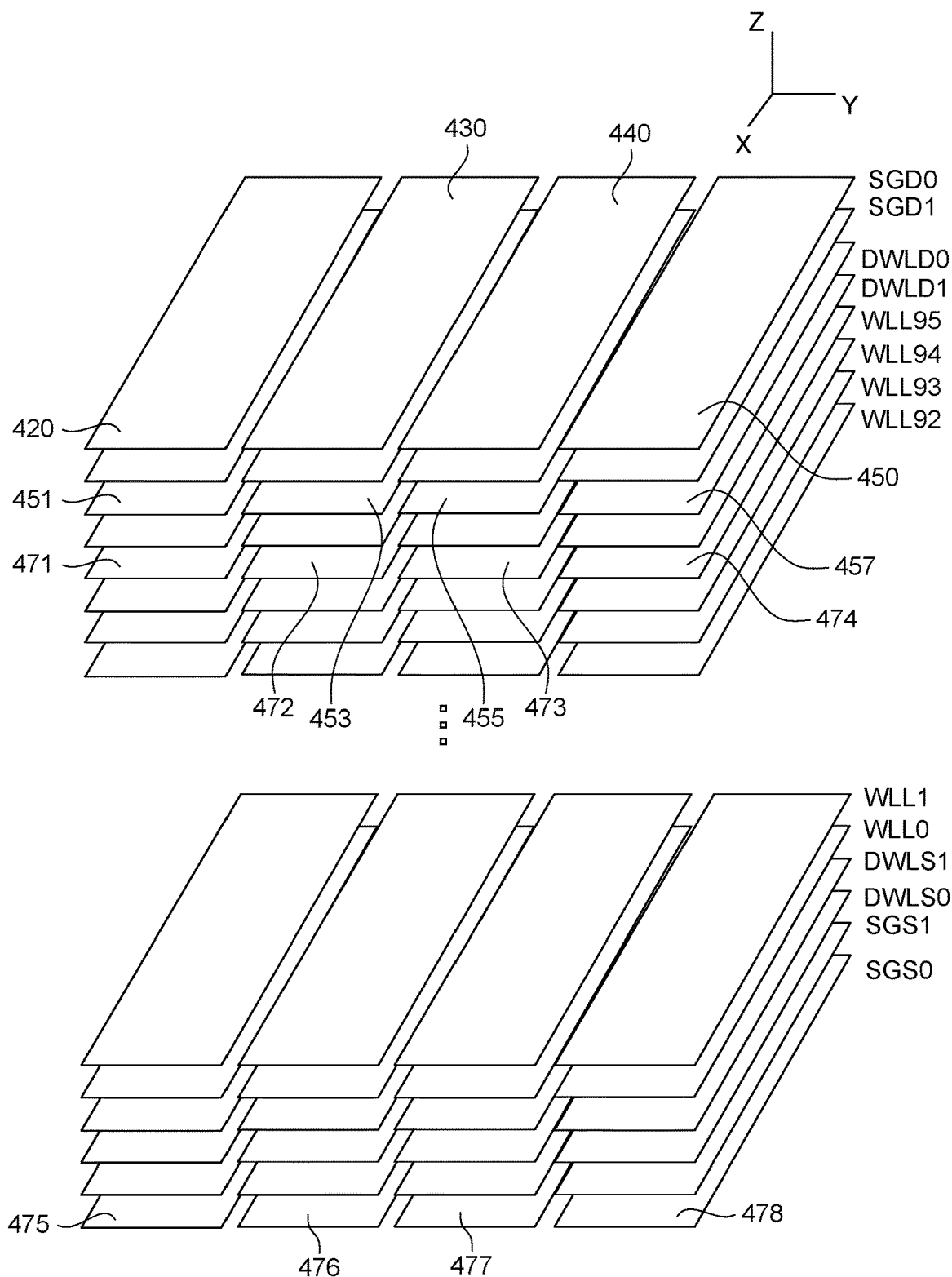
FIG. 4D depicts an alternative view of the select gate layers and wordline layers of the stack of FIG. 4C.
Figure 4E:
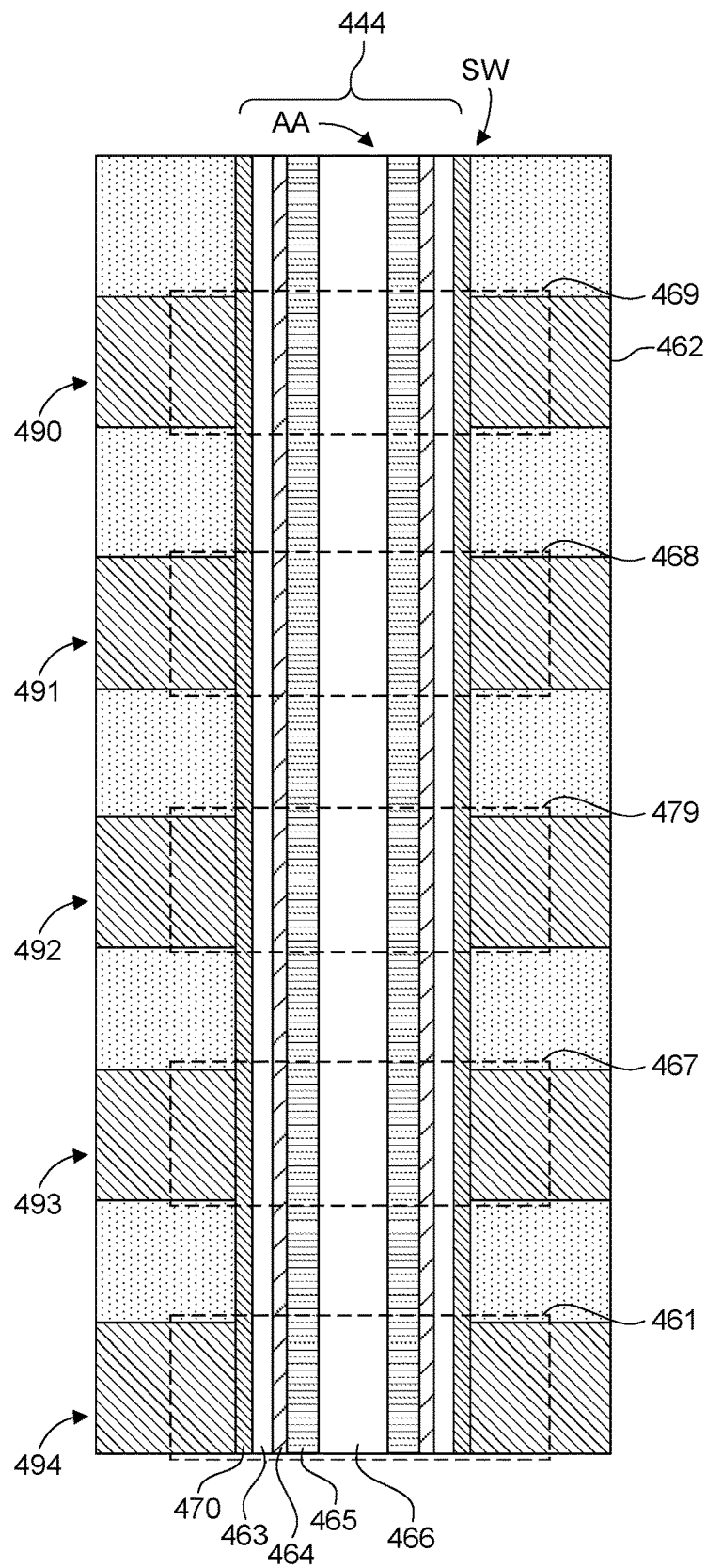
FIG. 4E depicts a view of a region of FIG. 4C.
Figure 4F:
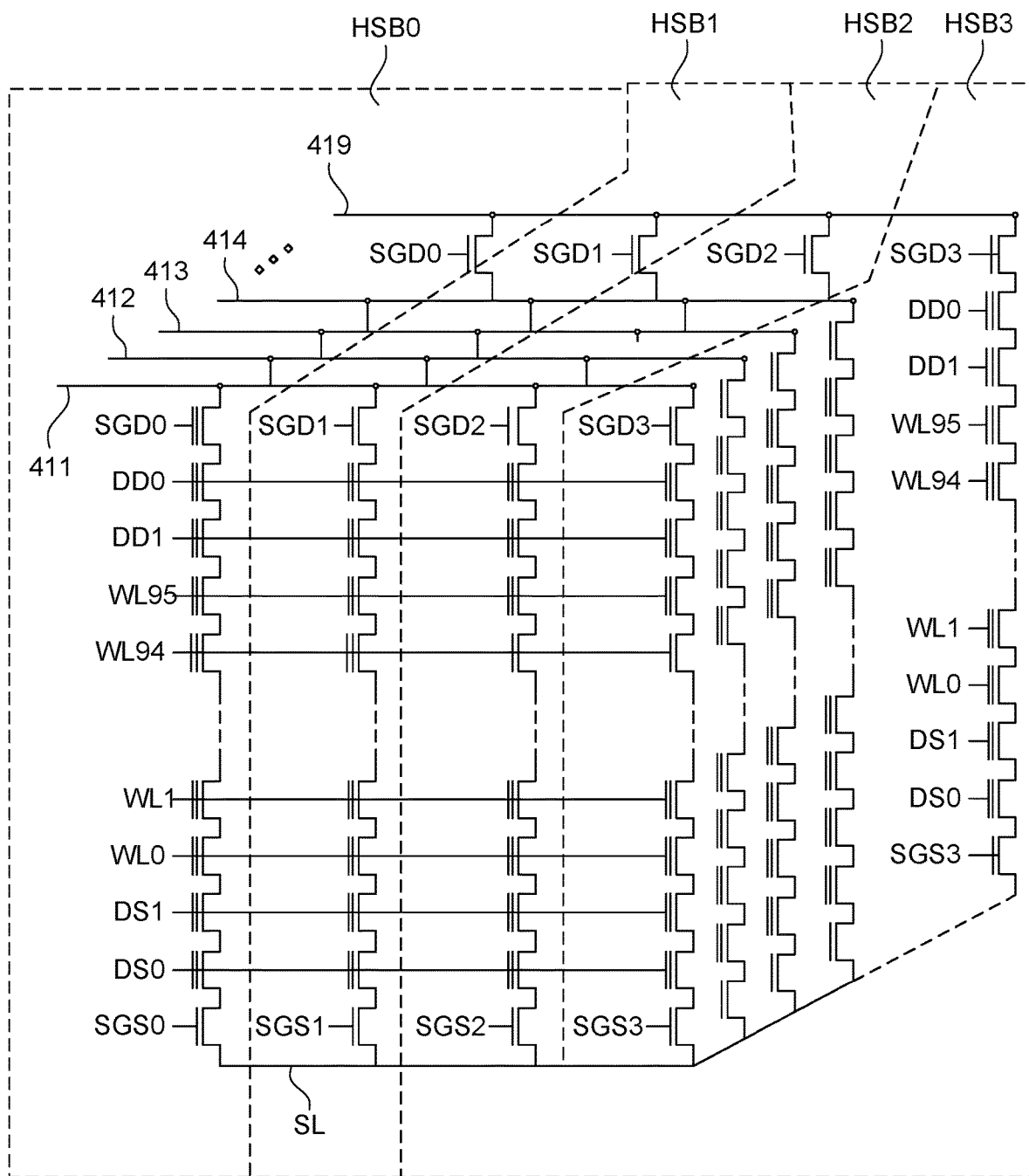
FIG. 4F is a schematic of a plurality of example NAND strings showing multiple horizontal sub-blocks, in connection with which, example embodiments of the disclosed technology can be implemented.
Figure 4G:
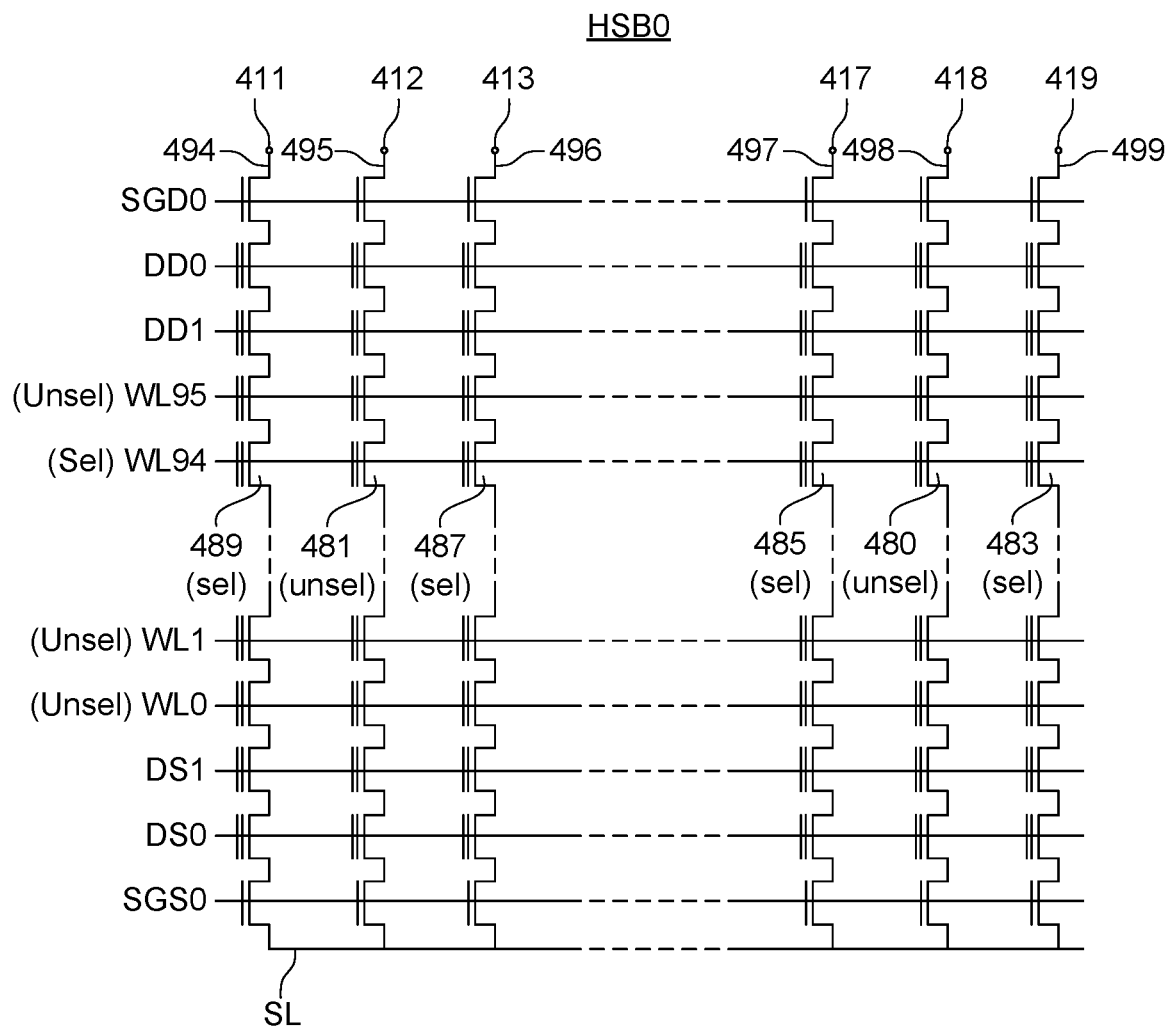
FIG. 4G is a schematic of a plurality of NAND strings showing one example horizontal sub-block, in connection with which, example embodiments of the disclosed technology can be implemented.
Figure 4H:
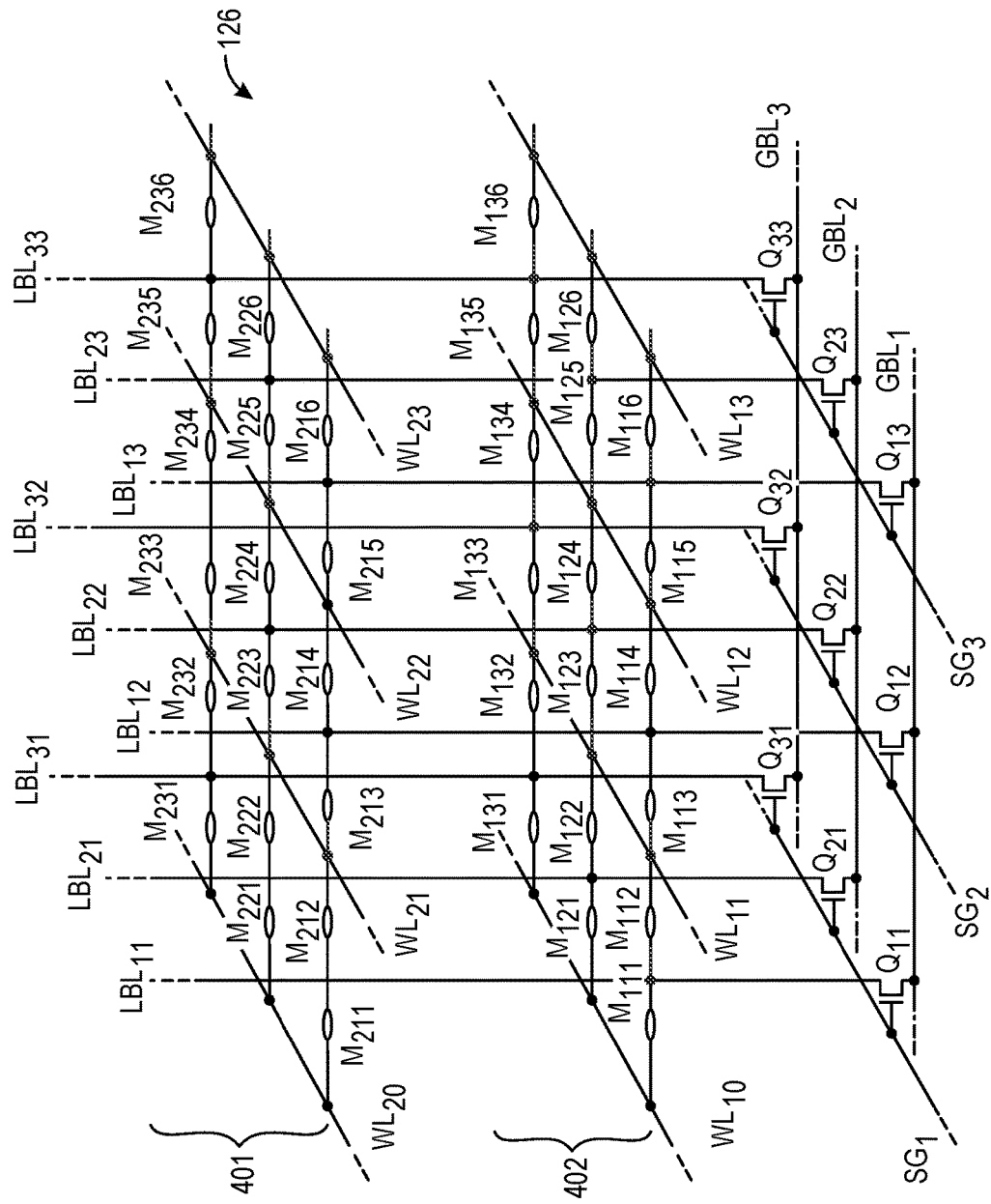
FIG. 4H depicts various embodiments of a portion of a three-dimensional memory array with a vertical cross-point structure, in connection with which, example embodiments of the disclosed technology can be implemented.

Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 206. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

FIG. 4E depicts a view of the region 445 of FIG. 4C. Data memory cell transistors 469 and 468 are above dummy memory cell transistor 479. Below dummy memory cell transistor 479 are data memory cell transistors 467 and 461. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 479 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 494, 495, 496, 497, 498, and 499; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 481 and 480 (which are connected to wordline WL94) are to remain in the erased state; therefore, memory cells 481 and 480 are unselected memory cells (labeled unsel in FIG. 4G). Additionally, assume, for example purposes, that memory cells 489, 487, 485 and 483 (which are connected to wordline WL94) are each to be programmed to a respective one of data states S1-S7; therefore, memory cells 489, 487, 485 and 483 are selected memory cells (labeled sel in FIG. 4G).

FIG. 4H illustrates another memory structure that can be used for the structure 126 of FIG. 1A. FIG. 4H illustrates a three-dimensional vertical cross-point structure, the wordlines still run horizontally, with the bitlines oriented to run in a vertical direction.

FIG. 4H depicts one embodiment of a portion of a monolithic three-dimensional memory array structure 126 that includes a first memory level 402 positioned below a second memory level 401. As depicted, the local bitlines LBL11-LBL33 are arranged in a first direction (e.g., a vertical direction) and the wordlines WL10-WL23 are arranged in a second direction perpendicular to the first direction. This arrangement of vertical bitlines in a monolithic three-dimensional memory array is one embodiment of a vertical bitline memory array. As depicted, disposed between the intersection of each local bitline and each wordline is a particular memory cell (e.g., memory cell M111 is disposed between local bitline LBL11 and wordline WL10). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bitlines GBL1-GBL3 are arranged in a third direction that is perpendicular to both the first direction and the second direction. A set of bitline select devices (e.g., Q11-Q31), such as a vertical thin film transistor (VTFT), may be used to select a set of local bitlines (e.g., LBL11-LBL31). As depicted, bitline select devices Q11-Q31 are used to select the local bitlines LBL11-LBL31 and to connect the local bitlines LBL11-LBL31 to the global bitlines GBL1-GBL3 using row select line SG1. Similarly, bitline select devices Q12-Q32 are used to selectively connect the local bitlines LBL12-LBL32 to the global bitlines GBL1-GBL3 using row select line SG2 and bitline select devices Q13-Q33 are used to selectively connect the local bitlines LBL13-LBL33 to the global bitlines GBL1-GBL3 using row select line SG3.

Referring to FIG. 4H, as only a single bitline select device is used per local bitline, only the voltage of a particular global bitline may be applied to a corresponding local bitline. Therefore, when a first set of local bitlines (e.g., LBL11-LBL31) is biased to the global bitlines GBL1-GBL3, the other local bitlines (e.g., LBL12-LBL32 and LBL13-LBL33) must either also be driven to the same global bitlines GBL1-GBL3 or be floated. In one embodiment, during a memory operation, all local bitlines within the memory array are first biased to an unselected bitline voltage by connecting each of the global bitlines to one or more local bitlines. After the local bitlines are biased to the unselected bitline voltage, then only a first set of local bitlines LBL11-LBL31 are biased to one or more selected bitline voltages via the global bitlines GBL1-GBL3, while the other local bitlines (e.g., LBL12-LBL32 and LBL13-LBL33) are floated. The one or more selected bitline voltages may correspond with, for example, one or more read voltages during a read operation or one or more programming voltages during a programming operation.

Figure 5:
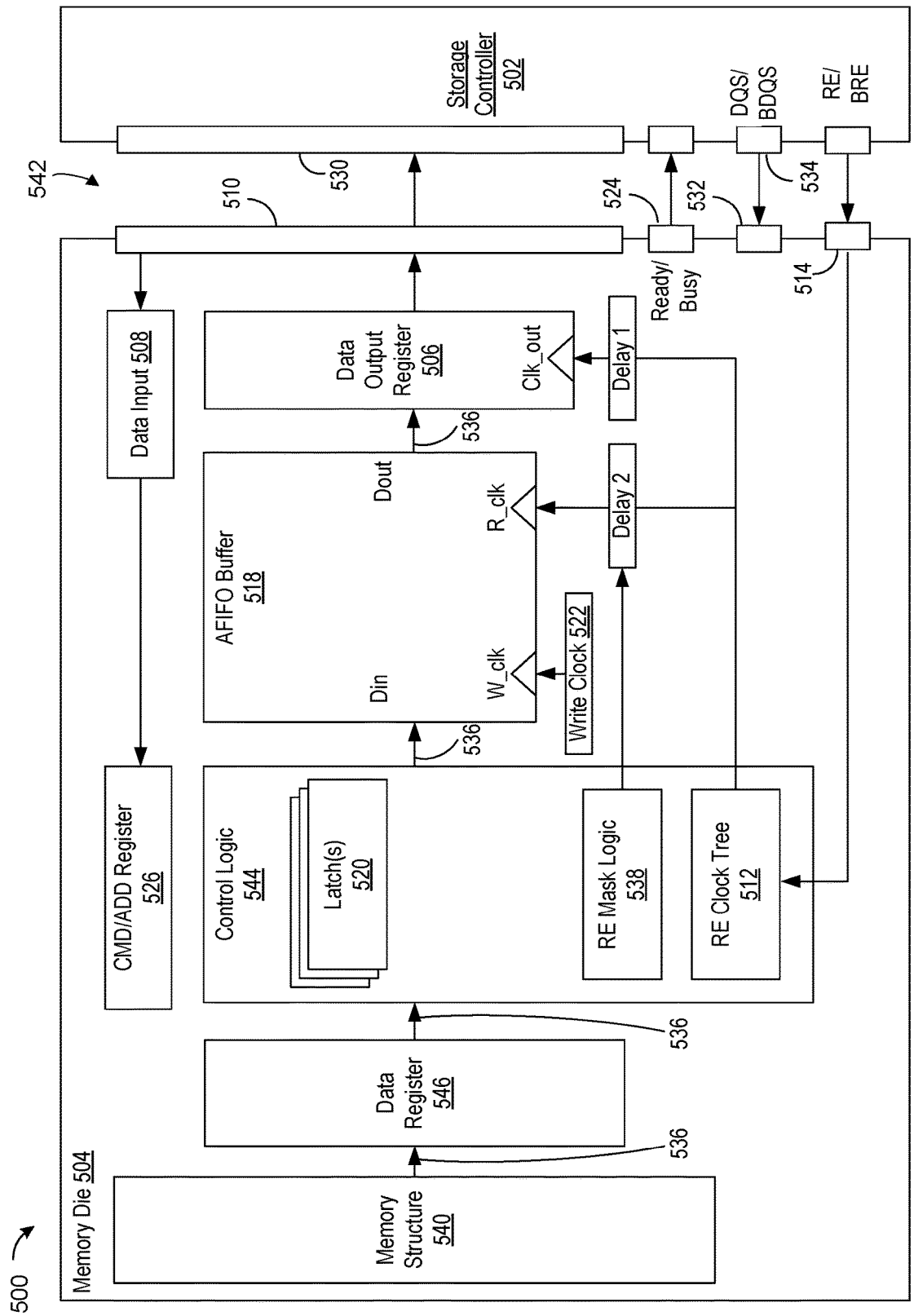
FIG. 5 is a block diagram of example memory device that depicts more details of an example memory die, in connection with which, embodiments of the disclosed technology can be implemented.

FIG. 5 is a block diagram of an example memory device 500 that depicts more details of an example memory die 504, in connection with which, embodiments of the disclosed technology can be implemented. The illustrative example of FIG. 5 depicts memory die 504 coupled to storage controller 502 via memory interface 542. The memory die may be an example implementation of memory 104a, the storage controller 502 is an example implementation of storage controller 102, and memory interface 542 is an example implementation of memory interface 224, as described above in connection with FIGS. 1-4H.

The memory die 504 includes a I/O interface 510, which may be implemented as a number of electrical contacts, data pins, data pads, etc. For example, I/O interface 510 may comprise 8, 16, 32, or some other number of data I/O pins. I/O interface 510 may be included, for example, as part of I/O circuit 222 of FIG. 2A. I/O interface 510 may be implemented to receive data from the storage controller 502 to be stored in the memory structure 540, to send data that was read from the memory structure 540 to the storage controller 502, to receive commands (e.g., read, write, erase, etc.), and/or to receive an address in the memory structure 540 to be written or read. The I/O interface 510 can be connected to storage controller 502 via memory interface 542. For example, the pads of the I/O interface may connect to a data bus, such as data bus 228 of FIG. 2A.

The I/O interface 510, according to some embodiments, may interface with an element other than the storage controller 502. For example, the storage controller 502 may be located on the memory die 504. In this case, the I/O interface 510 can be connected directly to a host device, such as host device 106 or 112 of FIG. 1. Note that in the example of FIG. 5, the memory device 500 might have other interfaces (not depicted in FIG. 5) that may connect directly to a host.

The memory die 504 includes memory structure 540 that allows data to be written to and read therefrom. Memory structure 540 is an example implementation of memory structure 206 of FIG. 2A. FIG. 5 also depicts a data register 546 coupled to the memory structure 540. The data register 546 can be configured to hold data to be written to or read from the memory structure 540. For example, data register 546 may cache or otherwise temporarily hold data to be written to or that is read from memory structure 540. Control logic 544 accesses data from the data register 546 and provides it to the data output register 506. In an example implementation, control logic 544 may be included as part of control circuit 214 of FIG. 2A. The data output register 506 can be configured to hold (e.g., cache or otherwise temporarily store) the data that is ultimately provided to the I/O interface 510.

The control logic 544 that is depicted is simplified so as to not obscure the diagram. Control logic 544 may include read/write circuits, which can include multiple sense blocks which allow a page (or other unit) of memory cells to be read or programmed in parallel. The data output register 506 may be considered to be part of the control logic 544. The control logic 544 cooperates with the read/write circuits to perform memory operations on the memory structure 540. The control logic 544 may include a state machine, an on-chip address decoder, and a power control module, as described above in connection with FIG. 2A. The state machine provides chip-level control of memory operations. The on-chip address decoder provides an address interface to convert between the address that is used by the host or a memory controller to the hardware address used by the decoders. The power control module controls the power and voltages supplied to the word lines and bit lines during memory operations.

Memory die 504 also comprises a read enable (RE) interface 514, which is an externally accessible electrical contact or terminal. The RE interface 514 can be implemented as an electrical contact, pad, pin, and so on for detecting a RE signal. The RE signal is provided on the RE interface 514 for clocking data from the memory structure 540 onto the I/O interface 510 an internal data bus 536. In some embodiments, the RE signal may be issued by the storage controller 502 via a control bus, such as control bus 226. Data read from memory structure 540 can be latched, with respect to a rising edge and/or falling edge of the RE signal, into the data output register 506. The data output register 506 can be located physically close to the I/O interface 510, and the I/O interface 510 may be accessed to read out data from the data output register 506 to an external device such as the storage controller 502. The RE signal, in various examples, can include a pair of complementary RE signals, such as a RE signal and BRE signal (e.g., a logical inverse of the RE signal). The BRE signal may be added for redundancy. The term "read enable" is used for clarity and is not intended to be limiting. The read enable signal could also be referred to as an output enable (OE) signal. Thus, the term "read enable," as used throughout this description, encompasses the term "output enable."

In an example implementation, memory die 504 may receive a read command on the I/O interface 510 indicating that data is to be read from the memory structure 540. For example, the memory die 504 may detect data on the I/O interface 510, which can be decoded to obtain a command code notifying the memory die to execute a read operation. The memory die 504 may then detect address information (such as an address code) on the I/O interface 510 that can be decoded to obtain an address of the data to be read within the memory structure 540. For example, a data input register 508 may be provided to receive data signals (e.g., command and/or address data) from an external device, such as the storage controller 502, via the I/O interface 510. The data input register 508 may receive the command and/or address data, which can be decoded and latched to a command/address register 526. The control logic 544 reads the memory structure 540 at the address specified by the address code. In an example, the address code may specify an address of data. In some examples, the address may specify a page, while in other examples the address may specify less than a page of data. The control logic 544 can then access the data at the specified address from the memory structure 540 and latch the data to the data register 546 via the internal data bus 536. While the example shown in FIG. 5 depicts one box for command/address register 526, it will be appreciated that the scope of the present disclosure is not limited to a single register. Command/address register 526 may be implemented as one or more command registers for caching or otherwise temporarily storing command data and one or more address registers for caching or otherwise temporarily storing address data.

The memory die 504 may also include other interfaces (e.g., pins or pads) in addition to the I/O interface 510. One other possibility is a ready/busy interface 524. This allows the memory die 504 to inform the storage controller 502, or host, of the status of the memory die 504. In some embodiments, the memory die 504 may inform the storage controller 502 over control bus 226. There may be several (e.g., four or any other number) of pins comprised in the ready/busy interface 524, such that the memory die 504 can send a separate read/busy signal for different logical units. Note that the I/O interface 510, the RE interface 514, the ready/busy interface 524, etc. may all be compliant with an industry specification (such as, but not limited to, a version of the Open NAND Flash Interface Specification). Thus, the location of pins, pads, etc. is constrained by industry specification, in one embodiment. This constraint can impact the length of data paths, and hence can affect signal delays.

The storage controller 502 may include a I/O interface 530, which may be implemented as a number of electrical contacts, data pins, data pads, etc. I/O interface 530 may comprise 8, 16, 32, or some other number of data I/O pins. The I/O interface 530 may be used to receive data that was read from the memory structure 540, to send data to be stored in the memory structure 540, to send commands (e.g., read, write, erase, etc.), and/or to send an address to the memory structure 540 to be written or read. In the example of FIG. 5, the I/O interface 530 be connected to memory die 504 via memory interface 542. For example, the pads of the I/O interface 530 may connect to data bus 228.

A data strobe (DOS) interface 532 may be provided on the memory die 504 and a DQS interface 534 provided on the storage controller. The DQS interfaces 532 and 534 may be implemented as an electrical contact, pad, pin, etc. A data strobe (DOS) signal is provided on the DQS interface 532/534 to indicate that data can be read from or written to the I/O interface 510. In some embodiments, the DQS signal may be detected at the memory die 504 from the storage controller 502 over a control bus, such as control bus 226. The DQS signal is used for clocking data out of or into the I/O interface 510. For example, data read from memory structure 540 may be latched into the data output register 506 according to the RE signal and then read from the I/O interface 510 with respect to a rising edge and/or falling edge of the DQS signal. The DQS signal, in various examples, can include a pair of complementary DQS signals, such as a DQS signal and BDQS signal (e.g., a logical inverse of the DQS signal). The BDQS signal may be added for redundancy.

In one embodiment, the data transfer rate from the I/O interface 510 may be double data rate (DDR). However, other modes including, but not limited to, single data rate (SDR) and quad data rate (QDR) are possible. For example, data can be latched on either of the rising or falling edges of the DQS/BDQS signal to achieve SDR, both of the rising and falling edges to achieve a double data rate (DDR), and so on.

One challenge with reading data from a memory device is to meet timing parameters such as read latency on the date path (e.g., from memory structure 540 to I/O interface 510). Read latency may be the time between when an RE signal is active (e.g., a rising or falling edge of the RE signal depending on the implementation) and when the data to be read is valid on the I/O interface 510 (e.g., present at data output register 506 and thus available on the I/O interface 510). The RE signal may be provided to the control logic 544 via an RE signal tree 512. The RE signal tree 512 refers to a clock network that distributes the RE signal to various parts of the memory device 500. The RE signal may be provided to several data latches 520 that form a pipeline in the control logic 544. Note that the data that is accessed from the memory structure 540 is moving in one direction, whereas the RE signal that is provided to the control logic 544 via the RE signal tree 512 is moving in the opposite direction. This can lead to challenges in synchronizing the RE signal that is provided to various components.

Figure 6:
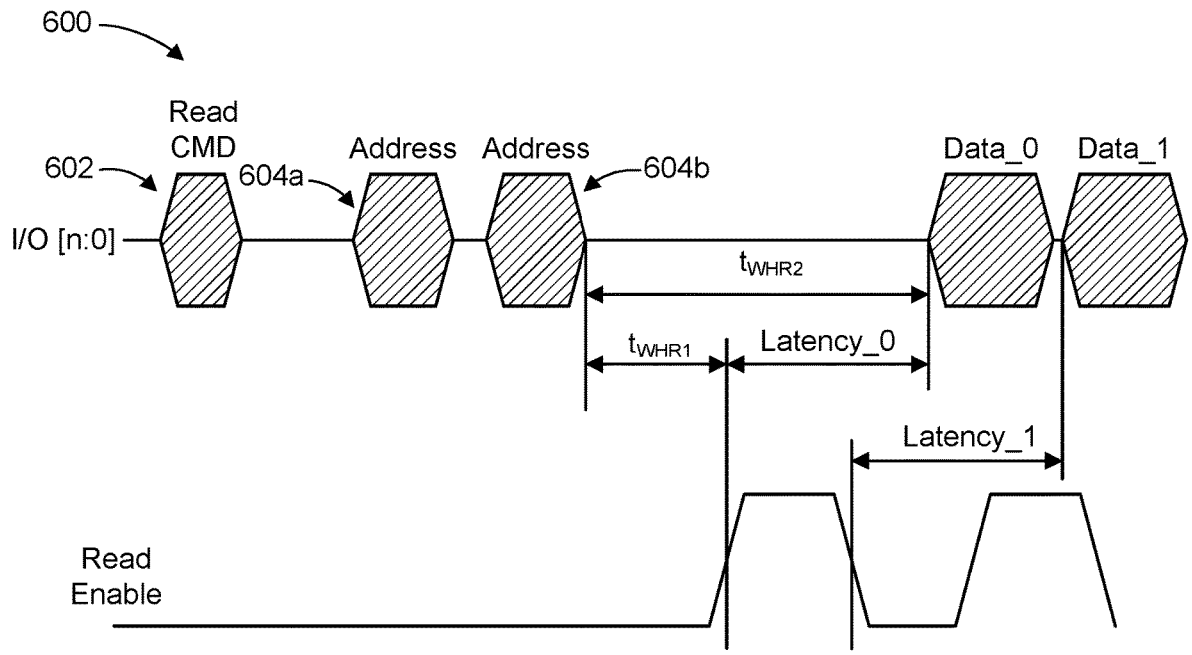
FIG. 6 is an example timing diagram of signals associated with a data read operation.

FIG. 6 is an example timing diagram 600 of signals associated with a data read operation out of a memory device. Timing diagram 600 includes data signals I/O[n:0] on the I/O interface 510 and an RE signal on the RE interface 514 of the memory die 504. In this example, the data signal is an "n" bit wide signal comprising [n:0] bits of data (e.g., I/O[n:0]), where "n" is an integer. For example, "n" could be 7, 1, 5, etc. The I/O interface 510 may include "n" pins connected "n" data lines of a data bus of memory interface 542, such as data bus 228 of FIG. 2A. The I/O interface 510 can detect data signals encoded with command codes (e.g., a read command 602), data signals encoded with addresses codes 604a and 604b, and data signals encoded with data to be read out of memory die 504 (e.g., data_0 and data_1). The RE signal may be a 1-bit wide clock signal detected on the RE interface 514 via a line of a control bus (e.g., control bus 226 of FIG. 2A). In the example of FIG. 6, the RE signal is active on both a rising edge (e.g., low to high transition) and a falling edge (e.g., a high to low transition).

In operation, with reference to FIG. 5, memory die 504 starts the read operation according to the read command code 602. For example, during a waiting period $t_{WHR1}$ after read command 602 is detected at the memory die 504, the RE signal is provided at a logic LOW level. During waiting period $t_{WHR1}$, memory die 504 decodes the addresses codes 604a and 604b and reads the data from memory structure 540 at the decoded address, which is latched to data register 546. Furthermore, during waiting period $t_{WHR1}$, the data passes through control logic 544 and is latched to the data output register 506. Then, after a waiting period $t_{WHR2}$ elapses, memory die 504 the data can be read out of I/O interface 510 as I/O [n:0] clocked according to the DQS signal. Waiting period $t_{WHR1}$ is a period of time that the memory die 504 takes to decode address codes 604a and 604b, latch the data to data output register 506, and fetch the data from data output register 506 over pipeline states of the control logic 544 being some distance from the I/O interface 510. For example, internal logic needs to be enabled, initial column address needs to be decoded and deciphered whether column redundancy replacement had occurred on specific column, and then moving data from the requested plane, column through the pipeline (e.g., latches 520). Then when the RE signal toggles, data will be available immediately from last stage of pipeline to I/O interface 510.

Latency is defined as a period of time between when an edge (also referred to as a transition) of the RE signal is detected and when data is validly on the I/O interface 510. For example, latency_0 of FIG. 6, represents the latency between a rising edge of the RE signal and Data_0 on a data pad I/O interface 510. Latency_1 represents the latency between a falling edge of RE signal and Data_1 on another data pad of I/O interface 510. The latency may be referred to as "tDQSRE." The waiting period $t_{WHR1}$ is the combination waiting period $t_{WHR1}$ and the latency from the first transition of the RE signal to the Data_0 (e.g., Latency_0).

In a conventional read operation, a version of the RE signal that is delayed by the RE signal tree is provided to the data output register at a clock input (Cl_in), which is not shown in FIG. 5. The Cl_in signal was then used to clock data into a data output register. The RE signal was also provided at a clock output (Cl_out) of the data output register. This RE signal was used to clock out the data from data output register onto the I/O interface. However, this RE signal may be ahead of the version of RE that is provided at Cl_in due to delays in the RE signal tree, and elsewhere.

One possible way to deal with such problems is to provide a plurality of signal delays. This is represented in FIG. 5 as RE delay 1 applied to the RE signal provided to the data output register 506. The delays may be introduced via delay stages provided at various points along the RE signal path, where the delay stages act as signal buffers and repeaters to ensure signal integrity of the RE signal between components over the path distance. Through the use of technologies such as place and route software, it may be possible to design circuitry with suitable delays such that the data that is provided from the I/O interface 510 meets latency specifications. However, as data rates increase, it becomes more challenging to design circuitry that meets latency specifications.

The memory die 104a may also include an asynchronous first-in-first-out (AFIFO) buffer 518, which helps to solve problems in meeting latency requirements. The AFIFO buffer 518 provides data to I/O interface 510 within a latency tolerance. The latency tolerance may be specified by an industry accepted specification. One such specification is the Open NAND Flash Interface Specification, Revision 3.2. However, embodiments are not limited to meeting timing parameters of this particular specification. Also, embodiments are not limited to NAND.

The AFIFO buffer 518 has a read clock input (R_clk), which may be used to clock data out of the AFIFO buffer 518 to the data output register 506 via Dout. The RE signal, delayed according to the RE signal tree 512, is provided to the read clock input of the AFIFO buffer 518.

The AFIFO buffer 518 also includes a write clock input (W_clk), which may be used to clock data into the AFIFO buffer 518 from the data register 546 via Din. A write clock generator 522 is shown as supplying a write clock to W_clk. The AFIFO buffer 518 can be designed, in accordance with some embodiments, such that the signal provided to R_clk and the signal provided to W_clk do not need to be synchronized. For example, write clock can be asynchronous from RE signal. The write clock can be provided in a number of ways. In some embodiment, the write clock may be internally generated by, for example, an oscillator implemented as the write clock generator 522. In some embodiments, the write clock is a delayed version of the RE signal, derived from the RE signal tree 512, that is provided to R_clk. However, these two signals do not need to be synchronized.

The AFIFO buffer 518 has a Din enable that may be used to enable the input of data at Din. For example, control logic 544 may prevent the AFIFO buffer 518 from inputting data or allow the AFIFO buffer 518 to input data (in accordance with W_clk), based on the state of a signal provided to Din enable.

The AFIFO buffer 518 has a Dout enable that may be used to enable the output of data at Dout. For example, control logic 544 may prevent the AFIFO buffer 518 from outputting data or allow the AFIFO buffer 518 to output data (in accordance with R_clk), based on the state of a signal provided to Dout enable. In one embodiment, the width of the interface for Din is the same as the bit width of the interface for Dout. However, this is not a requirement. The width of the interface for Dout may or may not be the same as the width of the I/O interface 510.

The AFIFO buffer 518 outputs data to the data output register 506. Data output register 506 could be located very close to the I/O interface 510 physically. The width of data that is output by the AFIFO buffer 518 is not necessarily the same as the bit width of the I/O interface 510. One possibility is for the AFIFO buffer 518 to output two bytes (e.g., 16 bits) in parallel. The data output register 506 could have a 6:1 MUX to output 8 bits in parallel on to the I/O interface 510. Many other possibilities exist. The data output register 506 may receive the RE signal at Cl_out, which it may use to clock data out of the data output register 506 to the I/O interface 510.

The AFIFO buffer 518 can be implemented in a variety of ways. In one embodiment, it is implemented as a circular buffer having a read pointer and a write pointer. In one embodiment, data moves through the AFIFO buffer 518 sequentially from Din to Dout in a series of storage elements (e.g., registers).

Note that the drawing is not to scale. Moreover, the drawing is not intended to represent all possible delays in data transmission. For example, there may be some delays associated with the lengths of transmission paths. The lengths of these paths are not intended to be represented in FIG. 5. For example, there might be some delay in the length of the data path, for example, between the I/O interface 510 and the data register 546. More particularly, data path lengths from data register 546 to each I/O pad of the I/O interface 510 may have differing lengths and delays may be provided to address these variations.

Another challenge with reading data out of a memory device, such as memory device 500, is power budgets that constrain power usage within the memory device. To stay within the power budget, it may be preferable to reduce the amount of power consumed by a memory device. One such way to reduce power consumption is through control of a clock signals used to latch data for executing data operations. Clock signals, such as the RE signal, are consistently toggled at a high speed to achieve the rising and falling edges on which data operations occur. Regardless of the data being read, the clock signal does not change and thus the toggling speed remains unchanged along the length of a clock path. A clock path is defined as the path that a clock signal traverses from its origin (e.g., RE interface 514 in the case of the RE signal of FIG. 5) to its destination (e.g., the point at which the clock signal is used to latch data, such as the Clk_out in the case of data output register 506, R_clk in the case data read out of AFIFO buffer 518 and so on). Furthermore, delay stages, such as signal buffers and repeaters, provided along the clock path must also be driven at high speed to ensure signal integrity of the clock signal over the entirety of the path length. For example, an RE interface detects an RE signal, which is promulgated throughout memory device as described above. This traversal involves operating various electrical components that must be driven so to repeat the RE signal in order to pass the RE signal downstream and validly latch data to the I/O interface.

Conventionally, the RE signal is toggled at a constant, high speed (e.g., constant duty cycle) regardless of the data read from memory structure. The various I/O pads that make up an I/O interface (such as I/O interface 510) may be physically spaced apart from each other and from an RE interface on which the RE signal is first detected (e.g., RE interface 514) at varying lengths of the clock path. Thus, to maintain the integrity of the RE signal, various distinct delay stages may be required and driven to ensure that the RE signal is maintained across differing lengths of the clock path. This leads to challenges in power consumption, as the majority of power consumed by a memory die during a read operation is due to maintaining the clock signal integrity.

Embodiments of the disclosed technology overcome this short coming of the conventional systems, in which the RE signal is toggled at a constant duty cycle, by masking the RE signal based on similarities within the data to be read from the memory structure 540 during a read operation. For example, as described above, data to be read according to the read operation is latched to the data register 546 prior to detecting the RE signal on the RE interface 514. Thus, the data for the data read operation is known to the control logic 544, which includes RE mask logic 538 configured to detect this data (e.g., latched in the data register 546) and use the data to create a clock mask according to the similarities within the data. In various embodiments, the RE mask logic 538 can be implemented to determine whether sequential portions of the data (e.g., bytes or units of bytes) are identical or different. Based on the determination, the RE mask logic 538 generates a clock mask comprising signals that can be provided to one or more delay stages along the clock path. For example, the clock mask may include one or more clock enable signals that can be provided to delay stages that gate the RE signal at the delay stages. For example, if sequential portions of the data are the same, the RE mask logic 538 may generate a clock enable signal that maintains a current logic state (e.g., logic high or logic low level) of the RE signal, thereby removing an edge associated with clocking the sequentially next portion of data on to the I/O interface 510. Since the edge is removed, the data that is latched to the I/O interface 510 is maintained at a previous state of data. Because the previous state is the same as the sequentially next state, the data on the I/O interface 510 remains valid and can be read from the memory die 504 according to the DQS signal. If sequential portions of the data are different, the RE mask logic 538 may generate one or more clock enable signals that permit normal operation of the RE signal (e.g., toggling), which latches data to the I/O interface 510 according to the RE signal.

Gating of the RE signal at a given delay stage may be achieved, for example, through logic gates and electrical components for realizing such gates. For example, an AND gate may be provided prior to a given delay stage. The AND gate may receive a clock enable signal of the clock mask and the RE signal at its inputs, and turn on/off the RE signal provided to the given delay stage according to the truth table for the AND gate. That is, if the clock enable signal is at a logic high state and the RE signal is at a logic high stage, the AND gate may turn on the RE signal provided to the delay stage. Whereas, if the clock enable signal is at a logic low state that edge of the RE signal corresponding to the clock enable signal at the logic low state may be turned off (e.g., removed). In some examples, a NAND gate and/or an XOR gate may be used in place of the AND gate for complimentary operations. Other logic gates, including one or more such logic gates, may be used to gate the RE signal.

The RE mask logic 538 that is depicted is simplified so as to not obscure the diagram. The RE mask logic 538 may include read/write circuits, comparator circuits, and the like which can be used to create the clock mask and store the clock mask for use upon detecting an RE signal at the RE interface 514. In various implementations, the RE mask logic 538 can be, for example, flip flops which check for changes in data to generate the clock enable signals of the clock mask.

Figure 7:
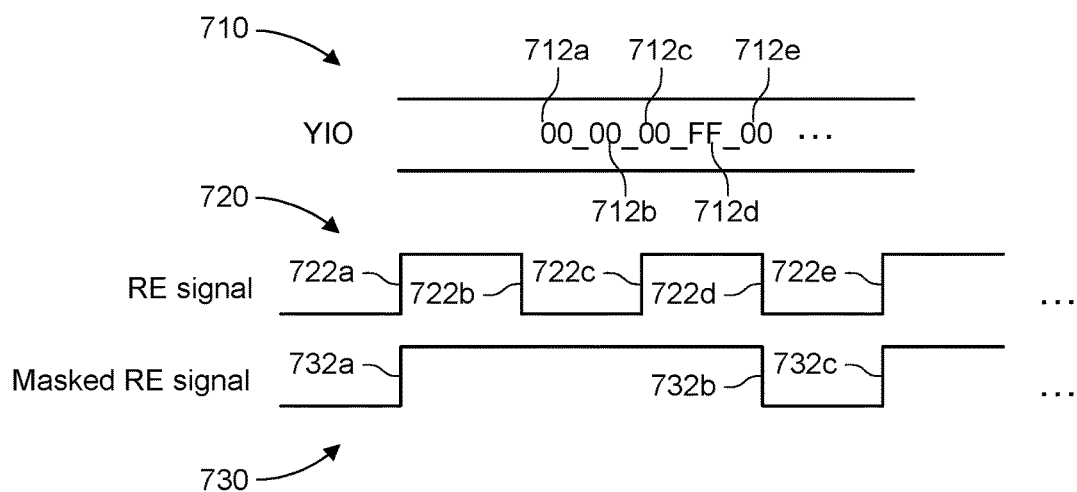
FIG. 7 illustrates an example data pattern, an example clock signal, and an example masked clock signal in accordance with embodiments of the disclosed technology.

Data latched at the data register 546 during a read operation comprises a data pattern. FIG. 7 illustrates an example data pattern 710 of data latched to data register 546, an example RE signal 720, and an example masked RE signal 730 in accordance with embodiments of the disclosed technology. The data pattern 710 may be obtained from the data register 546 by the RE mask logic 538 via an internal data bus YIO (such as the internal data bus 536 of FIG. 5). The RE signal 720 may be generated at the RE interface 514 by duplicating an RE signal detected at the RE interface 514 (e.g., from storage controller 502). The masked RE signal 730 is an example of a RE signal gated according to a clock mask generated by the RE mask logic 538 based on the data pattern 710. As described above, the data pattern 710 is latched to the data register 546 prior to receiving the RE signal 720. Thus, during the waiting period $t_{WHR1}$ of FIG. 6, the RE mask logic 538 receives the data pattern 710 via bus YIO and generates a clock mask according to similarities between sequential portions of data in the data pattern 710. The clock mask is used to gate the RE signal 720 and provide masked RE signal 730 for clocking data onto the I/O interface 510.

Data pattern 710 comprises a plurality of bytes 712a-e (collectively referred to herein as bytes 712) of data, each of which may be an example of a portion of data. The data to be read from the memory structure 540 according to the data read operation may be larger than data pattern 710, such that data pattern 710 represents a bundle of the data. Each byte 712 comprises n-bits of data forming a bit pattern, where "n" is an integer. The bit pattern comprises bit values arranged according to the bit pattern. For example, each byte of data may comprise an 8-bit wide bit pattern. In the illustrative example of FIG. 7, bytes 712 are shown in hexadecimal format, such that bytes 712a-c and 712e are provided as "00" convertible to a bit pattern of "00000000" and 712d is provided as "ff" convertible to a bit pattern of "11111111".

Re signal 720 comprises a plurality of edges 722a-e, each edge is provided for clocking a corresponding byte 712 to the I/O interface 510. For example, rising edge 722a is provided for latching byte 712a to the I/O interface 510, falling edge 722b is provided for latching byte 712b to the I/O interface 510, and so on. That is, in a conventional memory device, bit values of each byte 712 are each individually latched to a respective I/O pad of the I/O interface 510 at each edge 722 associated with each respective byte 712.

However, maintaining RE signal integrity across the memory die 500 consumes a significant amount of on-chip power, as explained above. Thus, RE mask logic 538 is configured to generate a clock mask based on similarities between sequential bytes of data. The clock mask can be used to gate the RE signal 720, which generates masked RE signal 730 for clocking the data pattern 710 onto I/O interface 510. For example, RE mask logic 538 can be configured to determine whether a byte (e.g., byte 712a) is the same as a sequentially next byte (e.g., byte 712b) of the data pattern. If the two bytes are identical (e.g., respective bit patterns contain identical bit values in the identical order), the RE mask logic 538 creates a clock enable signal that removes the edge of RE signal 720 associated with clocking the sequentially next byte (e.g., edge 722b), for example, by gating the RE signal. In the illustrative example of FIG. 7, byte 712a is "00" and byte 712b is "00", thus these bytes are identical and edge 722b of RE signal 720 is removed to create masked RE signal 730. The RE mask logic 538 continues to the next sequential pair of bytes (e.g., byte 712b and byte 712c) to remove edge 722c. However, if the sequential bytes are not identical, then the edge associated with the sequentially next byte is kept. For example, byte 712c is "00" but byte 712d is "ff", thus edge 722d is kept as edge 732b in masked RE signal 730.

The RE mask logic 538 performs the above comparison for each byte of the data pattern 710 to generate the clock mask that defines which edges of RE signal 720 to remove and which to keep. The clock mask can be provided as a collection of clock enable signals that are supplied to one or more delay stages along the RE signal path when a corresponding edge is received at the one or more delay stages, which are used to gate the RE signal at the one or more delay dates. That is, the clock enable signals are synchronized with the RE signal so to remove the indicated edge, while keeping the other edges. To synchronize the clock enable signals and the RE signal according to an example, the RE mask logic 538 can use the RE signal to check if data is the same or not, for example, using flip flops to create clock enable signals of the clock mask, and the clock enable signals are then used to gate the same RE signal downstream, which ensures the clock enable signals are synchronized with the appropriate edges of the RE signal.

The gated RE signal (or masked RE signal) traverses the rest of the clock path and is used to clock the data pattern 710 into the I/O interface 510. For example, masked RE signal 730 comprises edges 732a-c, which are used to latch data to the I/O interface 510. For example, byte 712a is latched to the I/O interface 510 according to rising edge 732a, byte 712d is latched to the I/O interface 510 according to falling edge 732b, and byte 712e is latched to the I/O interface 510 according to rising edge 732c. The byte of data on the I/O interface 510 between rising edge 732a and falling edge 732b is maintained at the same state as byte 712a (e.g., "00"). As a result, a data pattern can be validly read out of I/O interface 510 according to a DQS signal to create the data pattern 710 on the memory interface 542. That is, bytes corresponding to bytes 712b and 712c can be read out of I/O interface 510 according to the DQS signal because the bit patterns are the same as byte 712a latched to the I/O interface.

Figure 8:
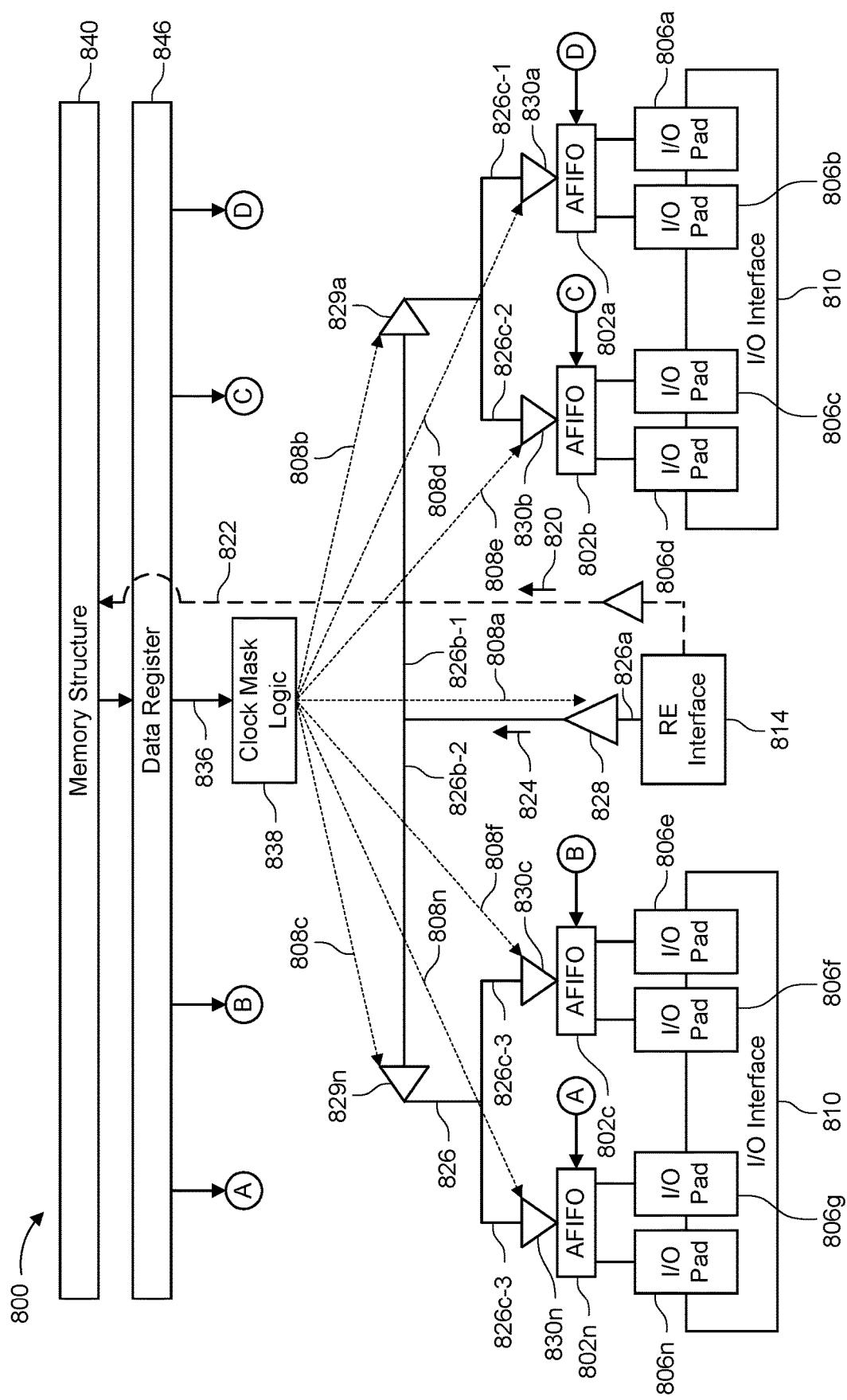
FIG. 8 is a schematic diagram of an architecture of a memory device including a masked clock signal that traverses through clock network according to a data pattern in accordance with embodiments of the disclosed technology.

FIG. 8 is a schematic diagram of an architecture 800 of a memory device (such as memory device 500) including a masked clock signal that traverses through clock network according to a data pattern in accordance with embodiments of the disclosed technology. Architecture 800 includes a clock tree including a clock path 826 over which a clock signal propagates to a plurality of AFIFO buffers 802a-n (collectively referred to herein as AFIFO buffers 802) for clocking data onto I/O interface 810. In various embodiments, each of AFIFO buffer 802 may be implemented as AFIFO buffer 518 of FIG. 5. The I/O interface 810, which is an example implementation of I/O interface 510 of FIG. 5, comprises a plurality of I/O pads 806a-n (collectively referred to herein as I/O pads 806). A byte of data can be latched to the I/O interface 810 according to high-speed clock signal 824 (e.g., an RE signal) detected at clock interface 814, which may be implemented as RE interface 514. Each bit of data that make up the byte can be latched to an assigned I/O pad 806. Each I/O pad 806 may also comprise or otherwise coupled to a data output register (such as data output register 506 of FIG. 5).

In the illustrative example of FIG. 8, I/O interface 810 comprises n-number of I/O pads 806 (also referred to as I/O pad [n:0]) physically distributed about a memory die (such as memory die 504) at varying distances from the clock interface 814. In some embodiments, pairs of physically close I/O pads can be connected to a common AFIFO buffer 802. In the example of FIG. 8, there are eight I/O pads 806 (e.g., I/O pads [7:0]) and four AFIFO buffers 802. Note that the number of bits (in parallel) from the AFIFO buffers 802 may or may not match the width of the I/O interface 810. Thus, the AFIFO buffers 802 might, but are not required to, output a unit of data for each unit that is expected on the I/O interface 810. For example, a given AFIFO buffer 802 may output two bits of data, one for each I/O pad 806 associated therewith. For example, as shown in FIG. 8, AFIFO buffer 802a may output a bit of data to I/O pad 806a (e.g., I/O pad [0]) and a bit of data to I/O pad 806b (e.g., I/O pad [1]), AFIFO buffer 802b may output a bit of data to I/O pad 806c (e.g., I/O pad [2]) and a bit of data to I/O pad 806d (e.g., I/O pad [3]), AFIFO buffer 802c may output a bit of data to I/O pad 806e (e.g., I/O pad [4]) and a bit of data to I/O pad 806f (e.g., I/O pad [5]), and AFIFO buffer 802n may output a bit of data to I/O pad 806g (e.g., I/O pad [6]) and a bit of data to I/O pad 806n (e.g., I/O pad [7]).

The architecture 800 includes a memory structure 840 (e.g., an example implementation of memory structure 540) that stores data. During a data read operation, data may be read from memory structure 840 according to a received address and read into AFIFO buffers 802 according to a clock signal. For example, a write clock (as described above in connection with FIG. 5) can be applied to a W_clk for reading data into the AFIFO buffers 802. The data can then be read out of AFIFO buffers 802 onto I/O pads 806 clocked according to RE signals applied, for example, to an R_clk of the AFIFO buffers 802.

Architecture 800 includes clock interface 814 (e.g., an example implementation of RE interface 514 of FIG. 5) that generates a clock signal based on a signal from an external source, such as storage controller 502 or a host device in some implementations. For example, clock interface 814 may detect an RE signal on a pad and generate an RE signal duplicative of the received signal. In some embodiments, the clock signal can be split into a data path clock signal 820 that travels along a first clock path 822 and a high-speed clock signal 824 that travels along a second clock path 826 of the clock network.

In some embodiments, the first clock path 826 supplies data path clock signal 820 for clocking data into AFIFO buffers 802 from memory structure 840. For example, a read command code and address code may be detected at I/O pads 806, which are used to latch data at the received address into the data register 846. Clock interface 814 may then generate clock signal 820 based on a received RE signal, which is used to clock the data from the register 846 into the AFIFO buffers 802, for example, as described above in connection with FIG. 5. In some embodiments, the data is written to the AFIFO buffers 802 using a write clock signal provided by an oscillator within the memory device, in place of the data path clock signal 820, as described above in connection with FIG. 5.

Data written to the AFIFO buffers 802 can be read from the AFIFO buffers 802 onto the I/O interface 810 according to the high-speed clock signal 824. For example, the high-speed clock signal 824 may be fed to a plurality of delay stages 829, 828a-n, and 830a-n, and then to the AFIFO buffers 802 for clocking data out of the AFIFO buffers 802 and onto the I/O pads 806. The data can then be read out of the I/O pads 806 by an external device, such as storage controller 102 and/or host devices in some scenarios, according to a DQS signal, as described above in connection with FIG. 5.

According to embodiments disclosed herein, the clock signal may be a version of a clock signal received at clock interface 814 (e.g., an example implementation of RE interface 514) that is gated according to a clock mask generated by clock mask logic 838 (e.g., an example implementation of RE mask logic 538 of FIG. 5). As described above, clock mask logic 838 generates the clock mask and supplies clock enable signals 808a-n (collectively referred to herein as clock enable signal 808) to delay stages 828, 829, and 830 based on the data pattern of the data read from the memory structure 840 in accordance with the read operation. For example, responsive to receiving an address for a read operation, as described above in connection with FIG. 5, data is latched to a data register 846 (e.g., data register 546 of FIG. 5) via internal bus 836 (e.g., internal bus 536 of FIG. 5), which is accessed by clock mask logic 838 to obtain the data pattern. The clock mask logic 838 then generates the clock mask from the data pattern, as described above in connection with FIG. 7.

Referring now to an example operation of the architecture 800 in more detail, architecture 800 may receive a read command on the I/O pads 806 notifying the architecture 800 that data is to be read from the memory structure 840. An address is then received on the I/O pads 806 that indicates an address of the data within the memory structure 840. The address can be provided to a data input register (e.g., data input register 508) and latched to an address register (e.g., address register 526). Control logic (e.g., control logic 544) reads the memory structure 840 at the address and latches the data to the data register 846, where the data is held for writing to the AFIFO buffers 802.

Clock interface 814 generates the clock signal, which may be split into data path clock signal 820 and high-speed clock signal 824, in an example implementation. A delay difference between the data path clock signal 820 and the time required to read data from the internal latches of the memory structure 840 (e.g., the latency as described in connection with FIG. 6) may be compensated for within a depth of the AFIFO buffers 802. Furthermore, delay stages 829-830 are provided to introduce delay to the high-speed clock signal 824. This delay may be introduced to enable the AFIFO buffers 802 to synchronize data that is read out from the memory structure 840 based on the data path clock signal 820 and read to the I/O pads 806 according to the high-speed clock signal 824. For example, delays may be introduced to the high-speed clock signal 824 to ensure that valid data is output from the AFIFO buffers 802.

In some embodiments, delay stages 828-830 may be provided at various points along the second clock path 826. Various ones of the delay stages 828-729 may act as signal repeaters to ensure signal integrity of the high-speed clock signal 824 over the second clock path 826 distance. In those scenarios in which delay is introduced to the high-speed clock signal 824, the clock signals may be delayed versions of the high-speed clock signal 824.

As shown in FIG. 8, second clock path 826 comprises a plurality of clock branching depths (or levels) delineated by ones of delay stages 829-730. That is, at various depths from clock interface 814 along second clock path 826 (e.g., lengths from the clock interface 814) a delay stage is provided to ensure signal integrity of the high-speed clock signal along a respective length. The I/O pads 806 and associated AFIFO buffers 802 may be logically grouped into the levels according to distances from the clock interface 814. For example, a first level or depth may correspond to AFIFO buffers 802 located more than a first distance 826a along second clock path 826 from the clock interface 814; a second depth may correspond to AFIFO buffers 802 located more than a second distance 826b from clock interface 814; and a third depth may correspond to AFIFO buffers 802 located more than a third distance 826c from clock interface 814. The first distance 826a is shorter than the second distance 826b and the second distance 826b is shorter than the third distance 826c. Thus, the number of AFIFO buffers 802 at each successive depth decreases. The delay stage 828 can be provided to ensure signal integrity of the high-speed clock signal 824 over first distance 826a of the second clock path 826. Delay stages 829a-n (collectively referred to herein as delay stages 829) can be provided to ensure signal integrity of the high-speed clock signal 824 over second distance 826b of the second clock path 826. The delay stage 830a-n (collectively referred to herein as delay stages 830) can be provided to ensure signal integrity of the high-speed clock signal 824 over third distance 826c of the second clock path 826.

Additionally, each AFIFO buffers 802 may be located at physically different locations on the memory die (e.g., memory die 504). For example, AFIFO buffer 802b may be closer to the clock interface 814 than AFIFO 802a; AFIFO buffer 802c may be closer than AFIFO buffer 802d; and each AFIFO buffers 802 may be a different distance from clock interface 814. Thus, for example, distance 826b-2 between delay stage 828 and delay stage 829b may be different than distance 826b-1 between delay stage 828 and delay stage 829a. Similarly, distance 826c-1 between delay stage 829a and delay stage 830a may be different from distance 826c-2 between delay stage 829a and delay stage 830b; distance 826c-3 between delay stage 829n and delay stage 830c may be different from distance 826c-4 between delay stage 829n and delay stage 830n; and so on.

Accordingly, the delay stages 828-830 can be provided to ensure signal integrity of the high-speed clock signal 824 as the high-speed clock signal 824 traverses over respective distances of the second clock path 826. Thus, the delay stages 828-830 may assist to ensure data is validly read out of the AFIFO buffers 802 onto I/O pads 806. For example, each AFIFO buffers 802 is supplied with a version of the clock signal (e.g., RE signal) that is delayed by respective ones of the delay stages 829-730.

As described above, conventional systems toggle clock signal, such as the RE signal, at a consistent and high speed throughout the clock network to provide for increased data transfer rates. Thus, in the case of FIG. 8, each delay stage 828-830 is driven so to output a clock signal that is a delayed version of the original clock signal. Such implementations require, at each delay stage 828-830, maintaining toggling speed at which the clock signal transitions between high and low logic levels. Given the high speed and constant duty cycle required in conventional systems for valid data operations, ensuring clock integrity consumes a significant amount of on die power.

The architecture 800 overcomes this short coming by generating the clock mask that is used to gate the clock signal at one or more of delay stages 828-830 based on the data pattern of the data latched to the data register 846. For example, as described above, data indicated by a received address is latched into data register 846. Prior to receiving an clock signal at the clock interface 814, clock mask logic 838 reads the data latched in the data register 846 and obtains a data pattern, for example, as described above in connection with FIG. 7. The clock mask logic 838 decodes the data pattern to detect bit values for each byte of data comprised in the data pattern.

From the bit values, clock mask logic 838 generates a clock mask by determining, for each byte of data, whether or not to remove a clock edge associated with latching each respective byte. The determination is based on comparing the bit values to determine similarities between bit values of sequential pairs of bytes in the data pattern, for example, as described above in connection with FIG. 7. In some embodiments, clock mask logic 838 may comprise one or more comparators configured to receive bit values of two sequential bytes and output a comparison result indicative of whether bit values are the same. For example, a first comparator may be provided that compares a byte and a sequentially next byte and outputs a comparison result indicating whether the two bytes are identical or not (e.g., logic high level indicating identical and logic low indicating different). In some embodiments, a second one or more comparators may be provided to compare first and second nibbles of the byte with first and second nibbles, respectively, of the sequentially next byte to determine if the first nibbles are the same and if the second nibbles are the same. A third one or more comparators may be provided to compare first, second, third, and fourth crumbs of the byte with first, second, third, and fourth crumbs, respectively, of the sequentially next byte to determine if the first crumbs are the same, second crumbs are the same, third crumbs are the same, and fourth crumbs are the same.

In another example, clock mask logic 838 may comprise comparators configured to compare respective bit values (e.g., data value) of a byte with respective bit values of the sequentially next byte (e.g., on a byte wise or bit wise basis). For example, comparators may be provided that compare a data value of a first bit of the byte with a data value of the first bit of the sequentially next byte, a data value of a second bit of the byte with a data value of a second bit of the sequentially next byte, and so on. From this comparison, the clock mask logic 838 can determine whether each byte, nibble, or crumb has the same or different data.

Upon detecting the high-speed clock signal 824 at clock interface 814, clock mask logic 838 generates clock enable signals 808 that is synchronized with the high-speed clock signal 824 for controlling one or more of delay stages 828-830 according to the determination. For example, clock enable signals 808 are provided to one or more delay stages 828-830 so to remove edges of the high-speed clock signal 824 used for clocking associated respective bytes of data, determined to be identical to a sequentially preceding byte, to the I/O pads 806 by gating the high-speed clock signal 824 at the one or more delay stages 828-830. For example, referring to FIG. 7, edge 722a of RE signal 720 is associated with latching byte 712a, edge 722b is associated with latching byte 712b, and so on. Clock mask logic 838 may determine that byte 712b is the same as byte 712a, byte 712c is the same as byte 712b, and byte 712d is different. Clock mask logic 838 generates a clock mask that contains clock enable signals for gating the RE signal 720 to remove edges 722b and 722c associated with byte 712b and 712c. The clock enable signals are provided to delay stage 828 as clock enable signal 808a that can gate the high-speed clock signal 824 at delay stage 828. The resulting gated high-speed clock signal 824 is provided to AFIFO buffers 802 having a shape of masked RE signal 730. Since the gated high-speed clock signal 824 traverses the entirety of the second clock path 826 to the AFIFO buffers 802, the clock enable signals 808b-n do not alter the operation of delay stages 829-830 since the high-speed clock signal 824 is already gated. Accordingly, power consumption by the delay stages 828-830 is reduced due to the absence of edges, which results in fewer toggles of the delay stages while maintain signal integrity and ensuring valid data is held at the I/O pads 806.

In some scenarios, the branch depth at which the high-speed clock signal 824 is gated according to the clock mask may be deeper within the clock network. For example, if a sequential pair of bytes are not identical, but a first nibble of a byte (e.g., first 4 bits of an 8-bit wide byte) is identical to a first nibble of a sequentially next byte (e.g., first 4 bits of sequentially next 8-bit wide byte) the high-speed clock signal 824 may be gated at the second depth at one of delay stages 829. For example, if the first nibbles assigned to I/O pads 806a-d and the second nibbles assigned to I/O pads 806e-n, clock mask logic 838 may issue clock enable signal 808b to delay stage 829a. Clock enable signal 808b gates the high-speed clock signal 824 at delay stage 829a to remove edges associated with the byte for latching the first nibble to I/O pads 806a-d. Meanwhile, the second nibbles (e.g., second 4 bits) may be different. As a result, clock enable signal 808c does not gate the high-speed clock signal 824 and delay stage 829b toggles according to an ungated (e.g., unmasked) high-speed clock signal 824.

As another example, if the nibbles are not identical, but a first crumb of a byte (e.g., first 2 bits of an 8-bit wide byte) is identical to a first crumb of a sequentially next byte (e.g., first 2 bits of sequentially next 8-bit wide byte), the high-speed clock signal 824 may be gated at the third depth at one of delay stages 830. For example, if the first crumb assigned to I/O pads 806a and 806b, clock mask logic 838 may issue clock enable signal 808d to delay stage 830a. Clock enable signals 808d gates the high-speed clock signal 824 at delay stage 830a to remove edges associated with the byte for writing the first crumb to I/O pads 806a and 806b. Meanwhile, the other crumbs (e.g., second, third, and fourth 2 bits) are different. Second, third, and fourth crumbs may be assigned to I/O pads 806c and 806d, I/O pads 806f and 806e, and I/O pads 806g and 806n, respectively, and clock enable signals 808e-n do not gate the high-speed clock signal 824 and delay stages 830b-n toggle according to an ungated high-speed clock signal 824.

While the above example is provided with only the first crumbs matching, the embodiments disclosed herein are not so limited. For example, two crumbs may match such that high-speed clock signal 824 provided to for latching both crumbs is gated. For example, the first crumbs may match and the third crumbs may match, in which case clock enable signals 808d and 808f may be used to gate the high-speed clock signal 824 at delay stages 830a and 830c. Other combinations are possible as well.

Figure 9A:
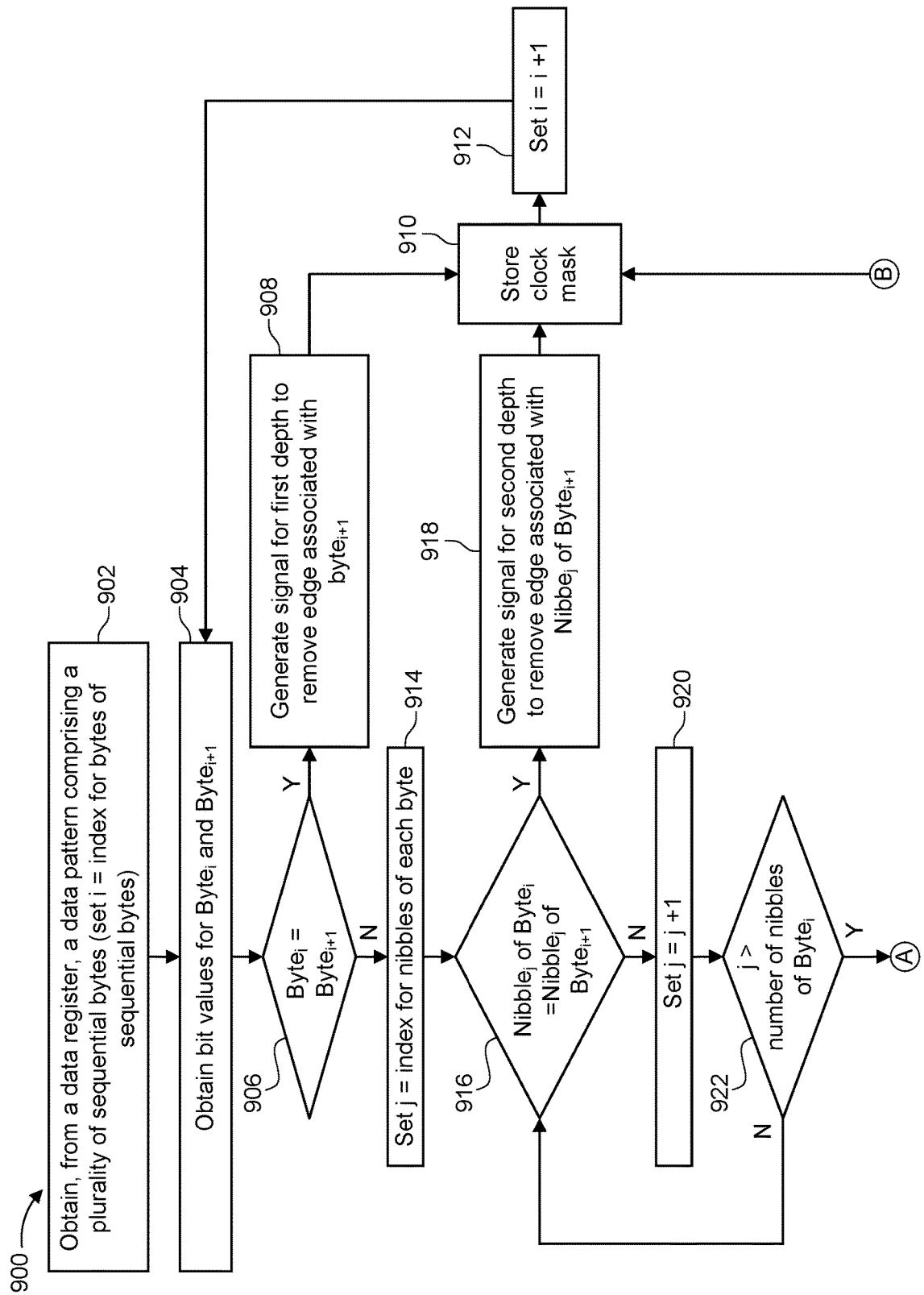
FIGS. 9A and 9B represent a flowchart of an example method for creating a clock mask according to embodiments of the disclosed technology.
Figure 9B:
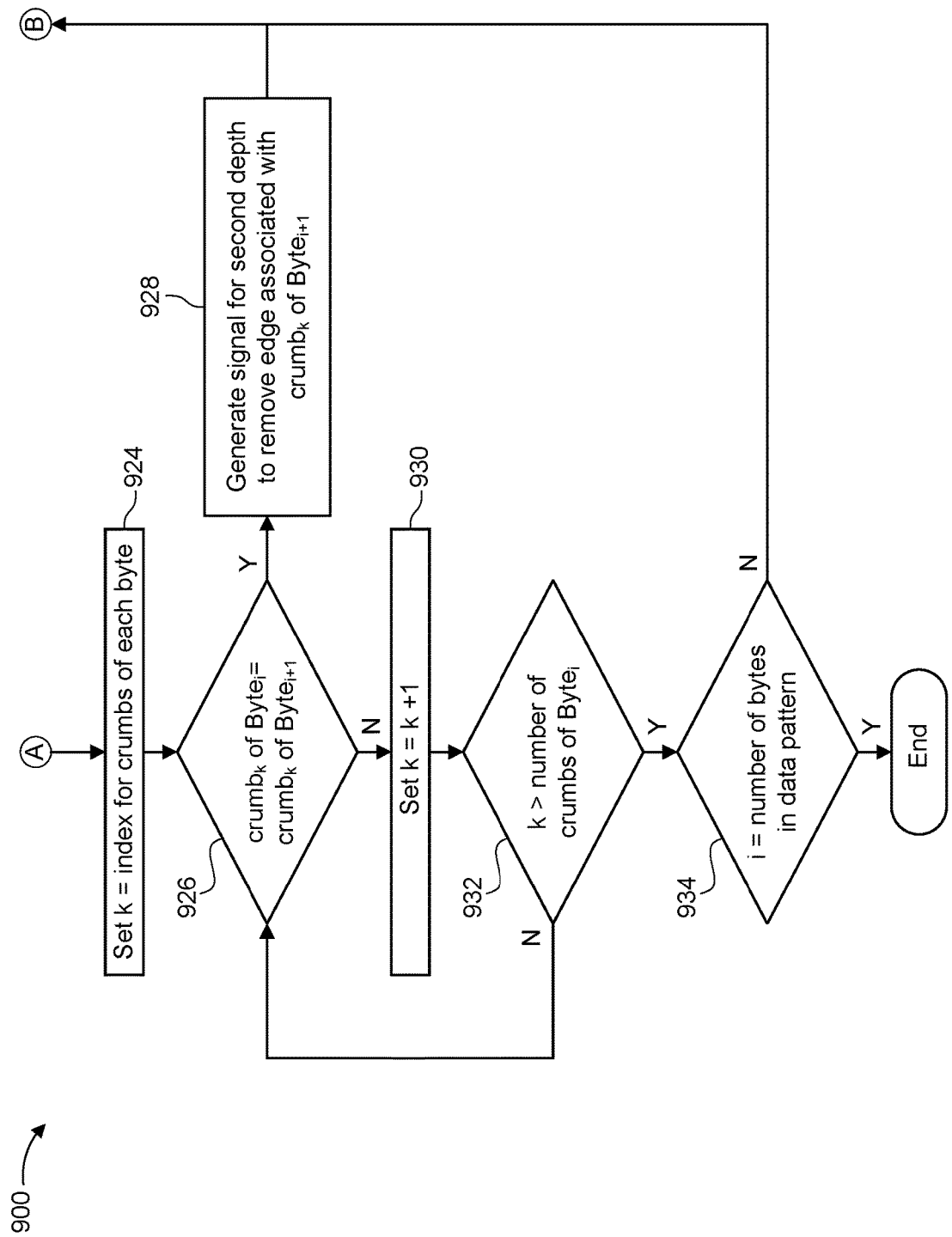

FIGS. 9A and 9B represent a flowchart of an example method 900 for creating a clock mask according to embodiments of the disclosed technology. The method 900 may be performed by a memory die (such as memory die 504 of FIG. 5 and/or memory die 104a of FIG. 2A) and/or architecture 800. More generally, the method 900 may be performed by any volatile or non-volatile memory system of a memory device such as a NAND device (or that is embedded therein) including, without limitation, a separately provided DRAM, an embedded microcontroller, or the like. In some embodiments, the instructions for performing the method 900 may be hardwired or fused into the memory core. The method 900 may be performed, for example, by RE mask logic 538 of FIG. 5 and/or clock mask logic 838 of FIG. 8.

At block 902, a data pattern is obtained, for example, from a data register. The data pattern includes a plurality of sequential bytes, such as data pattern 710 of FIG. 7. As described above, data may be latched to the data register as part of a data read operation, for example, based on an address of data within a memory structure. A clock mask logic may obtain the data from the data register via an internal data bus. Further, an index i may be provided. Initially, i can be set to an index of a first byte of the plurality of bytes that make up the data pattern.

At block 904, bit values for $byte_i$ and $byte_{i+1}$ (e.g., a next sequential byte) are obtained. For example, the data pattern may be decoded to obtain bit values, which may be provided in any format. For example, bytes may be provided in hexadecimal (e.g., FIG. 7), binary, and so on.

At decision block 906, a determination is made as to whether $byte_i$ is the same as $byte_{i+1}$. For example, block 906 may compare bit values obtained at block 904 and determine whether or not all the bit values of $byte_i$ are the same (e.g., identical) as all the bit values of $byte_{i+1}$. The comparison may be performed, for example, by one or more comparators, such as comprised in clock mask logic.

If $byte_i$ is the same as $byte_{i+1}$, method 900 proceeds to block 908 where a clock enable signal is generated, for example by clock mask logic, for a first depth of a clock network (e.g., as shown in FIG. 8), the clock enable signal is configured to remove an edge of a clock signal (such as an RE signal) associated with latching $byte_{i+1}$ to an I/O interface (e.g., I/O interface 510 or I/O interface 810). As described above, the first depth is a distance from a clock interface (such as an RE interface) to a delay stage (e.g., delay stage 828). The clock enable signal is stored to a clock mask (block 910) and counter i is incremented (block 912). Incrementing index i causes the method to proceed to the sequentially next byte (e.g., $byte_{i+1}$) as $byte_i$. The process then repeats block 904.

If $byte_{i+1}$ differs from $byte_i$ in any way, method 900 proceeds to block 914 where index j is provided. Initially, index j is set as an index of a first nibble of a plurality of nibbles that make up each byte. For example, an 8-bit wide byte comprises two nibbles of 4 bits each.

At decision block 916, a determination is made as to whether nibble; of $byte_i$ is the same as $nibble_j$ of $byte_{i+1}$. For example, decision block 916 may compare bit values obtained at block 904 and determine whether or not all the bit values of nibble; of $byte_i$ are the same as all the bit values of nibble; of $byte_{i+1}$. The comparison may be performed, for example, by one or more comparators, such as comprised in clock mask logic.

If they are the same, method 900 proceeds to block 918 where a clock enable signal is generated for a second depth of the clock network (e.g., by clock mask logic). The clock enable signal is configured to remove an edge of a clock signal associated with latching $byte_{i+1}$ to I/O pads assigned to the $nibble_j$ of $byte_{i+1}$. As described above, the second depth is a distance from a clock interface to delay stages that are farther from the clock interface than the first depth (e.g., delay stages 829). The clock enable signal is stored to a clock mask (block 910) and counter i is incremented (block 912).

If $nibble_j$ of $byte_{i+1}$ differs from $nibble_j$ of $byte_i$ in any way, method 900 proceeds to block 920 where index j is incremented. Incrementing index j causes the method to proceed to the sequentially next nibble (e.g., $nibble_j+1$) as $nibble_j$.

At decision block 922, a determination is made as to whether index j is greater than the number of nibbles in $byte_i$. For example, for an 8-bit wide byte, there are two nibbles. Thus, if j is less than or equal to two, method 900 proceeds to block 916 and repeats blocks 916-922. If j is greater than 2, method 900 proceeds to block 924.

At block 924, index k is provided. Initially, index k is set as an index of a first crumb of a plurality of crumbs that make up each byte. For example, an 8-bit wide byte comprises four crumbs of 2 bits each.

At decision block 926, a determination is made as to whether $crumb_k$ of $byte_i$ is the same as $crumb_k$ of $byte_{i+1}$. For example, decision block 926 may compare bit values obtained at block 904 and determine whether or not all the bit values of $crumb_k$ of $byte_i$ are the same as all the bit values of $crumb_k$ of $byte_{i+1}$. The comparison may be performed, for example, by one or more comparators, such as comprised in clock mask logic.

If they are the same, method 900 proceeds to block 928 where a clock enable signal is generated for a third depth of the clock network (e.g., by clock mask logic). The clock enable signal is configured to remove an edge of a clock signal associated with latching $byte_{i+1}$ to I/O pads assigned to the $crumb_k$ of $byte_{i+1}$. As described above, the third depth is a distance from a clock interface to delay stages that are farther from the clock interface than the second depth (e.g., delay stages 830). The clock enable signal is stored to a clock mask (block 910) and counter i is incremented (block 912).

If $crumb_k$ of $byte_{i+1}$ differs from $crumb_k$ of $byte_i$ in any way, method 900 proceeds to block 930 where index k is incremented. Incrementing index k causes the method to proceed to the sequentially next crumb (e.g., $crumb_k+1$) as $crumb_k$.

At decision block 932, a determination is made as to whether index k is greater than the number of crumb in $byte_i$. For example, for an 8-bit wide byte, there are four crumbs. Thus, if k is less than or equal to four, method 900 proceeds to block 926 and repeats blocks 926-932. If k is greater than four, method 900 proceeds to decision block 934, where a determination is made as to whether index i equals the number of bytes of the data pattern. If index i equals the number of bytes in the data patter, method 900 ends as $byte_i$ represents the last byte of the data pattern. If index i does not equal the number of bytes, the process proceeds to block 910, in which clock enable signals are generated that ensure a clock signal is ungated along the clock path (e.g., second clock path 826). Method 900 then proceeds to block 912 and then repeats block 904 for the next byte.

Figure 10:
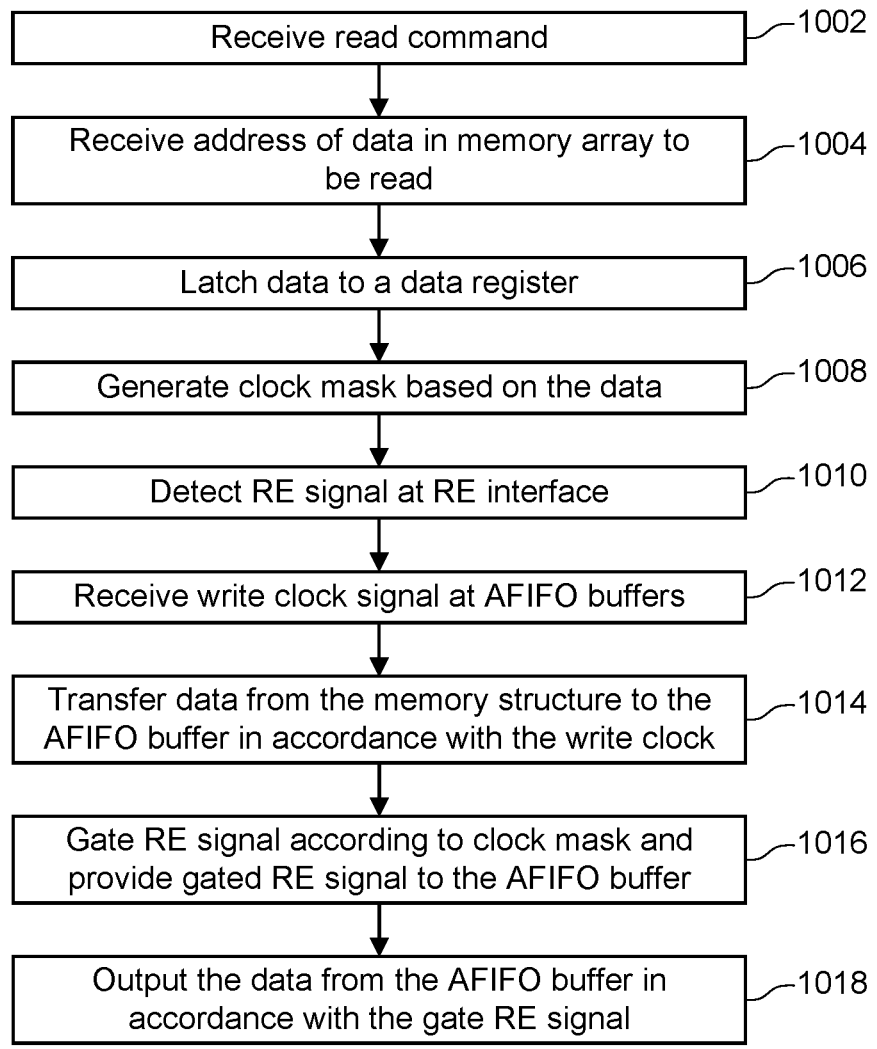
FIG. 10 is a flowchart of an example method for preforming a read operation according to embodiments of the disclosed technology.

FIG. 10 is a flowchart of an example method 1000 for preforming a read operation according to embodiments of the disclosed technology. The method 900 may be performed by a memory die (such as memory die 504 of FIG.

5 and/or memory die 104a of FIG. 2A) and/or architecture 800. More generally, the method 900 may be performed by any volatile or non-volatile memory system of a memory device such as a NAND device (or that is embedded therein) including, without limitation, a separately provided DRAM, an embedded microcontroller, or the like. In some embodiments, the instructions for performing the method 900 may be hardwired or fused into the memory core.

At block 1002, a read command is received. For example, data encoded with a read command code is detected on an I/O interface (e.g., I/O interfaces 510 and/or 810), which is decoded and latched to a command register (e.g., register 526). The command may be provided by a storage controller (e.g., storage controller 502) or some other entity.

At block 1004, an address of data to be read is received. For example, data encoded with an address code is detected on the I/O interface, which is decoded and latched to an address register (e.g., register 526). This address code may specify an address, within a memory structure (e.g., memory structures 540 and/or 840), for the data to be read. The number of bits in the address may exceed the width of the I/O interface (e.g., the number of I/O pads). Thus, the address may be provided in more than one piece. FIG. 6 shows the address being provided in two pieces, but this is just for illustration. As another example, a column address could be provided in two pieces and a row address could be provided in three pieces, for a total of five.

At block 1006, the data at the received address is latched to a data register (e.g., data registers 546 and/or 846). Block 1006 refers to transferring data from the memory structure to the data register prior to detecting an RE signal on an RE interface (e.g., RE interface 514 and/or 814).

At block 1008, a clock mask is generated based on the data latched during block 806. For example, a clock mask may be generated according to a data pattern of the data so to remove clocking edges associated with second bytes of data that are identical to first bytes of data that sequentially precede the second byte of data. In some implementations, clocking edges associated with nibbles and/or crumbs may also be removed, for example, in a case that the first and second bytes are not identical. Further details regarding generating the clock mask is provided above in connection with FIGS. 5 and 7-9.

At block 1010, an RE signal is detected the RE interface. The RE signal is used for clocking data out of the core memory structure and onto the I/O interface. The RE signal is detected at the RE interface after both the read command and the address are detected. The data latched into the data register (block 1006) is known prior to receipt of the RE signal, thereby allowing for generating the clock mask at block 1008 before the RE signal is detected.

At block 1012, a write clock signal is provided to the AFIFO buffers. The write clock signal may be asynchronous from the signal provided at the read clock input of the AFIFO buffers. In some embodiments, the write clock signal may be a delayed version of the RE signal. In another embodiment, the write clock signal may be provided by an oscillator within the memory device.

At block 1014, data is transferred from the data register to the AFIFO buffers in accordance with the write clock signal.

At block 1016, the RE signal is gated according to the clock mask generated at block 1008. As described above, the clock mask comprises instructions for generating clock enable signals that are provided at various points along the clock path of the RE signal (e.g., at various delay stages at various depths). The clock enable signals are executed to gate the RE signal according to the data that is latched to the data register prior to receiving the RE signal. As a result, edges of the RE signal associated with sequentially identical bytes, nibbles, or crumbs can be removed from the RE signal for clocking the bytes, nibbles, or crumbs, respectively. At block 1016, the gated RE signal is provided to AFIFO buffer (e.g., AFIFO buffer 518 and/or 802) for clocking data onto the I/O interface. For example, the gated RE signal is provided to R_clk of an AFIFO buffer.

At block 1018, units of data are output from the AFIFO buffers in accordance with the gated RE signal. As a result, data is output and latched to the I/O interface at each transition of the RE signal, while data is held (or maintained) at a previously latched state in a case where the associated transition (e.g., edge) is removed. Accordingly, even though new bits of data may not be latched to I/O pads of the I/O interface, the bits remain valid since they are either the same as the previously latched bit or are latched according to a RE signal transition. Note that the number of bits (in parallel) from the AFIFO buffers may or may not match the width of the I/O interface. Thus, the AFIFO buffers might, but are not required to, output a unit of data for each unit that is expected on the I/O interface. For example, a given AFIFO buffers may output two bits of data, one for each I/O pad.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (Saas). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method of operating a memory device, comprising:
receiving a command to read data from a memory structure of the memory device;
latching a bit pattern of the data from the memory structure to a data register based on the received command;
generating a clock mask based on the bit pattern latched to the data register;
detecting a read enable signal on a read enable interface of the memory device;
gating the read enable signal based on the clock mask; and
latching bit values to an input/output (I/O) interface of the memory device in accordance with the gated read enable signal.

2. The method of claim 1, wherein bit values latched to the I/O interface are output from the memory device in accordance with a data strobe signal received from a device external to the memory device.

3. The method of claim 1, wherein the clock mask is generated based on similarities in bit values between of units of sequential bytes of the bit pattern.

4. The method of claim 3, wherein a unit of a byte is at least one of a byte, a nibble, a crumb, and a bit.

5. The method of claim 3, wherein generating the clock mask comprises:
determining that a bit value of a unit of a first byte is identical to a bit value of a unit of a sequential byte; and
in response to the determination, generating a clock enable signal configured to remove a transition edge of read enable signal associated with the sequential byte.

6. The method of claim 5, wherein gating the read enable signal comprises removing the transition edge of the read enable signal associated with latching a bit value for the sequential byte on the I/O interface based on the clock enable signal, wherein a bit value latched to the I/O interface for the first byte is maintained on the I/O interface for the sequentially next byte based on the gated read enable signal.

7. The method of claim 1, wherein the bit pattern comprises a first byte having a first plurality of bit values, the first plurality of bit values having at a least a first subset of the first plurality of bit values, and a second byte having a second plurality of bit values, the second plurality of bit values having at a least a first subset of the second plurality of bit values, wherein generating the clock mask comprises:
responsive to determining that the first plurality of bit values are not identical to the second plurality of bit values, determining the first subset of the first plurality of bit values is identical to the first subset of the second plurality of bit values; and
generating a clock enable signal configured to remove a transition edge of read enable signal associated with the latching the first subset of the second plurality of bit values to the I/O interface.

8. A memory device comprising:
a memory structure storing data;
a data register;
an input/output (I/O) interface configured to transmit and receive data signals;
a read enable interface configured to detect a read enable signal;
a controller communicatively coupled to the memory structure, the data register, the I/O interface, and the read enable interface, the controller configured to:
latch a bit pattern of data from the memory structure to the data register based on detecting a command to read data from the memory structure;
generate a clock mask based on the bit pattern latched to the data register;
detect a read enable signal on the read enable interface;
gating the read enable signal based on the clock mask; and
latch bit values to the I/O interface of the memory device in accordance with the gated read enable signal.

9. The memory device of claim 8, wherein the controller is further configured to output bit values latched to the I/O interface in accordance with a data strobe signal received from a device external to the memory device.

10. The memory device of claim 8, wherein the clock mask is generated based on similarities in bit values between of units of sequential bytes of the bit pattern.

11. The memory device of claim 10, wherein a unit of a byte is at least one of a byte, a nibble, a crumb, and a bit.

12. The memory device of claim 10, wherein generating the clock mask comprises:
determining that a bit value of a unit of a first byte is identical to a bit value of a unit of a sequential byte; and
in response to the determination, generating a clock enable signal configured to remove a transition edge of read enable signal associated with the sequential byte.

13. The memory device of claim 12, wherein gating the read enable signal comprises removing the transition edge of the read enable signal associated with latching a bit value for the sequential byte on the I/O interface based on the clock enable signal, wherein a bit value latched to the I/O interface for the first byte is maintained on the I/O interface for the sequentially next byte based on the gated read enable signal.

14. The memory device of claim 8, wherein the bit pattern comprises a first byte having a first plurality of bit values, the first plurality of bit values having at a least a first subset of the first plurality of bit values, and a second byte having a second plurality of bit values, the second plurality of bit values having at a least a first subset of the second plurality of bit values, wherein generating the clock mask comprises:
responsive to determining that the first plurality of bit values are not identical to the second plurality of bit values, determining the first subset of the first plurality of bit values is identical to the first subset of the second plurality of bit values; and generating a clock enable signal configured to remove a transition edge of read enable signal associated with the latching the first subset of the second plurality of bit values to the I/O interface.

15. A memory device comprising:
a clock interface configured to detect a clock signal;
a clock path configured to supply the clock signal from the clock interface to a plurality of input/output (I/O) pads, the clock path comprising a plurality of delay stages;
a memory structure storing data; and
a controller configured to:
generate clock enable signals based on a bit pattern of the data fetched from the memory structure prior to the clock interface detecting the clock signal,
apply the clock enable signals to one or more of the plurality of delay stages to gate the detected clock signal, and
latch the bit pattern to the plurality of I/O pads according to the gated clock signal.

16. The memory device of claim 15, wherein the controller is further configured to output bit values latched to the plurality of I/O pads according to a data strobe signal.

17. The memory device of claim 15, wherein the clock enable signals are generated based on identical bit values between units of sequential bytes of the bit pattern.

18. The memory device of claim 16, wherein a unit of a byte is at least one of a byte, a nibble, a crumb, and a bit.

19. The memory device of claim 16, wherein the one or more delay stages supplied with the clock enable signal are based on which bit values of sequential bytes of the bit pattern are identical.

20. The memory device of claim 15, wherein each of the plurality of delay stages are driven to repeat the detected clock signal to the plurality of I/O pads, wherein applying the clock enable signals to one or more of the plurality of delay stages comprises gating the detected clock signal at the one or more of the plurality of delay stages.

* * * * *